(12) United States Patent
Akao et al.

(10) Patent No.: US 11,160,311 B2
(45) Date of Patent: Nov. 2, 2021

(54) INHALATION COMPONENT GENERATION DEVICE, METHOD FOR CONTROLLING INHALATION COMPONENT GENERATION DEVICE, AND PROGRAM

(71) Applicant: JAPAN TOBACCO INC., Tokyo (JP)

(72) Inventors: Takeshi Akao, Tokyo (JP); Hajime Fujita, Tokyo (JP); Manabu Yamada, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 0 days.

(21) Appl. No.: 16/851,278

(22) Filed: Apr. 17, 2020

(65) Prior Publication Data

US 2020/0237006 A1  Jul. 30, 2020

Related U.S. Application Data

(63) Continuation of application No. PCT/JP2017/037752, filed on Oct. 18, 2017.

(51) Int. Cl.
*A24F 40/53* (2020.01)
*A24F 40/57* (2020.01)
(Continued)

(52) U.S. Cl.
CPC .............. *A24F 40/53* (2020.01); *A24F 40/50* (2020.01); *A24F 40/51* (2020.01); *A24F 40/57* (2020.01); *A24F 40/90* (2020.01); *H03M 1/12* (2013.01); *A24F 40/10* (2020.01); *A24F 40/40* (2020.01); *A24F 40/60* (2020.01)

(58) Field of Classification Search
None
See application file for complete search history.

(56) References Cited

U.S. PATENT DOCUMENTS 5,561,362 A   10/1996  Kawamura et al.
6,236,215 B1   5/2001  Kanehira
(Continued)

FOREIGN PATENT DOCUMENTS

CN   101228697 A   7/2008
EP      2701268 A1   2/2014
(Continued)

OTHER PUBLICATIONS

English translation of Sato (JPH07239735A) (Year: 1995).*
(Continued)

*Primary Examiner* — Michael H. Wilson
*Assistant Examiner* — Katherine A Will
(74) *Attorney, Agent, or Firm* — Xsensus LLP

(57) ABSTRACT

This inhalation component generation device comprises: a load which vaporizes or atomizes an inhalation component source using power from a power supply; and a control unit. The control unit comprises: a voltage sensor which uses a predefined correlation to convert the analog voltage value of a power supply to a digital voltage value and outputs the digital voltage value; and a power control unit which controls the supply of power from the power supply to the load on the basis of the digital voltage value. The control unit is configured to be capable of calibrating the correlation on the basis of changes in the digital voltage value or the analog voltage value obtained during charging of the power supply.

5 Claims, 17 Drawing Sheets

(51) Int. Cl.
    *A24F 40/51*     (2020.01)
    *A24F 40/50*     (2020.01)
    *H03M 1/12*     (2006.01)
    *A24F 40/90*     (2020.01)
    *A24F 40/40*     (2020.01)
    *A24F 40/10*     (2020.01)
    *A24F 40/60*     (2020.01)

(56) References Cited

U.S. PATENT DOCUMENTS

| | | |
|---|---|---|
| 2002/0196025 A1 | 12/2002 | Freeman et al. |
| 2009/0167575 A1 | 7/2009 | Mitani et al. |
| 2012/0230659 A1 | 9/2012 | Goodman et al. |
| 2013/0300425 A1* | 11/2013 | Shiraishi ............ G01R 31/3835 324/426 |
| 2013/0306084 A1 | 11/2013 | Flick |
| 2015/0189916 A1 | 7/2015 | Wu |
| 2015/0212161 A1 | 7/2015 | Soga et al. |
| 2016/0242466 A1 | 8/2016 | Lord et al. |
| 2017/0027234 A1 | 2/2017 | Farine et al. |
| 2017/0238605 A1 | 8/2017 | Matsumoto et al. |
| 2017/0238606 A1 | 8/2017 | Matsumoto et al. |
| 2018/0226695 A1 | 8/2018 | Miyaki et al. |
| 2019/0307166 A1 | 10/2019 | Matsumoto et al. |

FOREIGN PATENT DOCUMENTS

| | | |
|---|---|---|
| EP | 2856893 A1 | 4/2015 |
| EP | 3219212 A1 | 9/2017 |
| JP | 06-242192 A | 9/1994 |
| JP | 07-128416 A | 5/1995 |
| JP | 07-184627 A | 7/1995 |
| JP | 07-239735 A | 9/1995 |
| JP | 09-26470 A | 1/1997 |
| JP | 11-052033 A | 2/1999 |
| JP | 11-237455 A | 8/1999 |
| JP | 2000-251948 A | 9/2000 |
| JP | 2001-094661 A | 4/2001 |
| JP | 2002-34164 A | 1/2002 |
| JP | 2002-148323 A | 5/2002 |
| JP | 2003-100356 A | 4/2003 |
| JP | 2003-317811 A | 11/2003 |
| JP | 2005-538499 A | 12/2005 |
| JP | 2007-168305 A | 7/2007 |
| JP | 2007-180972 A | 7/2007 |
| JP | 2010-050045 A | 3/2010 |
| JP | 2010-122162 A | 6/2010 |
| JP | 2012-70474 A | 4/2012 |
| JP | 2014-501106 A | 1/2014 |
| JP | 2014-48101 A | 3/2014 |
| JP | 2014-512207 A | 5/2014 |
| JP | 2014-131872 A | 7/2014 |
| JP | 2016-176709 A | 10/2016 |
| JP | 2016-533712 A | 11/2016 |
| JP | 2017-005985 A | 1/2017 |
| JP | 2017-022852 A | 1/2017 |
| JP | 2017-514463 A | 6/2017 |
| JP | 6176383 B1 | 8/2017 |
| JP | 2017-167034 A | 9/2017 |
| WO | 2014/046232 A1 | 3/2014 |
| WO | 2014/150942 A2 | 9/2014 |
| WO | 2016/075747 A1 | 5/2016 |
| WO | 2016/075748 A1 | 5/2016 |
| WO | 2016/076178 A1 | 5/2016 |
| WO | 2017/013823 A1 | 1/2017 |

OTHER PUBLICATIONS

English translation of Mustafa (CN101228697) (Year: 2008).*
Extended European search report dated Oct. 16, 2020, in corresponding European patent Application No. 17929222.2, 8 pages.
Extended European search report dated Oct. 16, 2020, in corresponding European patent Application No. 17929279.2, 10 pages.
Office Action dated Jun. 5, 2020 in Japanese Patent Application No. 2019-549057, 5 pages.
Office Action dated Jun. 24, 2020 in Japanese Patent Application No. 2019-549056, 13 pages.
Office Action dated Jun. 29, 2020 in Japanese Patent Application No. 2019-549058, 12 pages.
Extended European search report dated Oct. 13, 2020, in corresponding European patent Application No. 17929079.6, 8 pages.
Notice of Reasons for Refusal dated Mar. 11, 2020 in Japanese Patent Application No. 2019-549055, 4 pages.
Decision to Grant a Patent dated Apr. 9, 2020 in Japanese Patent Application No. 2019-549055, 5 pages.
International Search Report and Written Opinion dated Dec. 26, 2017 for PCT/JP2017/037752 filed on Oct. 18, 2017, 9 pages including English Translation of the International Search Report.
International Search Report and Written Opinion dated Jan. 23, 2018 for PCT/JP20171037756 filed on Oct. 18, 2017, 9 pages including English Translation of the International Search Report.
International Search Report and Written Opinion dated Dec. 26, 2017 for PCT/JP2017/037754 filed on Oct. 18, 2017, 12 pages including English Translation of the International Search Report.
International Search Report and Written Opinion dated Dec. 19, 2017 for PCT/JP2017/037755 filed on Oct. 18, 2017, 8 pages including English Translation of the International Search Report.
Extended European search report dated Oct. 2, 2020, in corresponding European patent Application No. 17928906.1, 8 pages.
Canadian Office Action dated May 25, 2021, in corresponding Canadian Patent Application No. 3,079,163.
Office Action dated Jun. 16, 2021, in corresponding Canadian patent Application No. 3,079,154, 8 pages.

* cited by examiner

INHALATION COMPONENT GENERATION DEVICE, METHOD FOR CONTROLLING INHALATION COMPONENT GENERATION DEVICE, AND PROGRAM

CROSS REFERENCE TO RELATED APPLICATION

The present application is a continuation application of International Application No. PCT/JP2017/037752, filed on Oct. 18, 2017.

TECHNICAL FIELD

The present invention relates to an inhalation component generation device which comprises a load for vaporizing or atomizing an inhalation component source by using electric power from an electric power source, a method for controlling the inhalation component generation device, and a program.

BACKGROUND ART

In place of a cigarette, an inhalation component generation device (such as an electronic cigarette and a heated tobacco product) for tasting an inhalation component, that is generated by vaporizing or atomizing a flavor source such as tobacco and so on and an aerosol source by a load such as a heater, has been suggested (Patent Literatures 1-3). Such an inhalation component generation device comprises a load for vaporizing or atomizing a flavor source and/or an aerosol source, an electric power source for supplying electric power to the load, and a control unit for controlling the load and the electric power source. The load is a heater, for example.

In such an inhalation component generation device, there is room for improvement with respect to electric control relating to electric power supplied to a load and charging/discharging of an electric power source.

Patent Literatures 4-6 disclose methods for estimating deterioration of electric power sources. Patent Literatures 7 and 8 disclose methods for monitoring abnormality in electric power sources. Patent Literature 9 discloses a method for suppressing deterioration of an electric power source. Patent Literatures 10-12 disclose processes for calibrating a state of charge (SOC) and charge capacity of batteries, when electric power sources have been fully charged under a predetermined condition. Patent Literatures 4-12 do not explicitly show application of the above methods to inhalation component generation devices.

CITATION LIST

Patent Literature

PTL 1: PCT international publication No. WO 2014/150942
PTL2: Japanese Patent Application Public Disclosure No. 2017-514463
PTL3: Japanese Patent Application Public Disclosure No. H07-184627
PTL4: Japanese Patent Application Public Disclosure No. 2000-251948
PTL5: Japanese Patent Application Public Disclosure No. 2016-176709
PTL6: Japanese Patent Application Public Disclosure No. H11-052033
PTL7: Japanese Patent Application Public Disclosure No. 2003-317811
PTL8: Japanese Patent Application Public Disclosure No. 2010-050045
PTL9: Japanese Patent Application Public Disclosure No. 2017-005985
PTL 10: PCT international publication No. WO 2014/046232 PTL11: Japanese Patent Application Public Disclosure No. H07-128416
PTL12: Japanese Patent Application Public Disclosure No. 2017-022852

SUMMARY OF INVENTION

The gist of a first characteristic is that the first characteristic comprises an inhalation component generation device which comprises a load for vaporizing or atomizing an inhalation component source by electric power from an electric power source, and a control unit; wherein the control unit comprises a voltage sensor for converting an analog voltage value of the electric power source to a digital voltage value by using a predefined correlation, and outputting the digital voltage value, and a power control unit for controlling, based on the digital voltage value, supply of electric power from the electric power source to the load; and the control unit is configured to be able to calibrate the correlation, based on change in the digital voltage value or the analog voltage value obtained during charging of the electric power source.

The gist of a second characteristic is that the second characteristic comprises the inhalation component generation device in the first characteristic, wherein the control unit is configured to be able to calibrate the correlation in such a manner that a maximum value or a maximal value of the digital voltage value, or the digital voltage value greater than a threshold value, obtained during charging of the electric power source, corresponds to a full-charge voltage value of the electric power source.

The gist of a third characteristic is that the third characteristic comprises the inhalation component generation device in the second characteristic, wherein the correlation is calibrated in such a manner that correspondence between the analog digital value and the digital voltage value is subjected to gain adjustment.

The gist of a fourth characteristic is that the fourth characteristic comprises the inhalation component generation device in the second characteristic, wherein the correlation is calibrated in such a manner that correspondence between the analog digital value and the digital voltage value is subjected to offset adjustment.

The gist of a fifth characteristic is that the fifth characteristic comprises the inhalation component generation device in the fourth characteristic, wherein the correlation comprises at least one of correspondence between an analog voltage value and a digital voltage value smaller than a discharge cutoff voltage of the electric power source, and correspondence between an analog voltage value and a digital voltage value greater than a full-charge voltage of the electric power source.

The gist of a sixth characteristic is that the sixth characteristic comprises the inhalation component generation device in any one of the second characteristic to the fifth characteristic, wherein, in the correlation, the larger analog voltage values are associated with the larger digital voltage values; and the correlation at the time of production or activation of the inhalation component generation device is calibrated or set in such a manner that the analog voltage value, that is smaller than the analog voltage value corresponding to a full-charge voltage value when no error exists in the voltage sensor, corresponds to the full-charge voltage value.

The gist of a seventh characteristic is that the seventh characteristic comprises the inhalation component generation device in any one of the second characteristic to the fifth characteristic, wherein, in the correlation, smaller analog voltage values are associated with larger digital voltage values; and the correlation at the time of production or activation of the inhalation component generation device is calibrated or set in such a manner that an analog voltage value, that is larger than an analog voltage value corresponding to a full-charge voltage value when no error exists in the voltage sensor, corresponds to the full-charge voltage value.

The gist of an eighth characteristic is that the eighth characteristic comprises the inhalation component generation device in the sixth characteristic or the seventh characteristic, wherein the correlation at the time of production or activation of the inhalation component generation device is calibrated or set in such a manner that the analog voltage value, that corresponds to a value that is the closest to a value obtained by subtracting an absolute value of the product error from the full-charge voltage, when the product error does not exist in the voltage sensor, in a plurality of the digital voltage values that can be outputted from the voltage sensor, corresponds to the full-charge voltage value.

The gist of a ninth characteristic is that the ninth characteristic comprises the inhalation component generation device in any one of the second characteristic to the eighth characteristic, wherein the control unit is configured in such a manner that the control unit makes judgment as to whether a digital voltage value outputted by the voltage sensor during charging of the electric power source exceeds a threshold value, and that the control unit calibrates the correlation when the digital voltage value has exceeded the threshold value.

The gist of a tenth characteristic is that the tenth characteristic comprises the inhalation component generation device in the ninth characteristic, wherein, when the digital voltage value outputted by the voltage sensor during charging of the electric power source has exceeded the threshold value, the control unit updates the threshold value to the digital voltage value that has exceeded the threshold value.

The gist of an eleventh characteristic is that the eleventh characteristic comprises the inhalation component generation device in the ninth characteristic or the tenth characteristic, wherein the threshold value at the time of production or activation of the inhalation component generation device is set to a value smaller than the full-charge voltage.

The gist of a twelfth characteristic is that the twelfth characteristic comprises the inhalation component generation device in any one of the ninth characteristic to the eleventh characteristic, wherein the threshold value at the time of production or activation of the inhalation component generation device is set to a value that is in a plurality of the digital voltage values that can be outputted by the voltage sensor, and is equal to or smaller than a value obtained by subtracting an absolute value of the product error from the full-charge voltage.

The gist of a thirteenth characteristic is that the thirteenth characteristic comprises the inhalation component generation device in the twelfth characteristic, wherein the threshold value at the time of production or activation of the inhalation component generation device is set to a value that is in a plurality of the digital voltage values that can be outputted by the voltage sensor, and is the maximum value in a range of values wherein any of the values in the range is equal to or less than a value obtained by subtracting an absolute value of the product error from the full-charge voltage.

The gist of a fourteenth characteristic is that the fourteenth characteristic comprises the inhalation component generation device in any one of the first characteristic to the thirteenth characteristic, wherein the control unit is configured to be able to estimate or detect at least one of deterioration and failure in the electric power source, based on a digital voltage value outputted by the voltage sensor by using the calibrated correlation.

The gist of a fifteenth characteristic is that the fifteenth characteristic comprises the inhalation component generation device in the fourteenth characteristic, wherein charging of the electric power source can be controlled by an external charger which is separate from the inhalation component generation device; the inhalation component generation device comprises a stopping unit for blocking or reducing charging current to the electric power source; and the control unit is configured to activate the stopping unit for forcibly stopping or restricting charging of the electric power source by the external charger, when at least one of deterioration and failure in the electric power source is estimated or detected.

The gist of a sixteenth characteristic is that the sixteenth characteristic comprises the inhalation component generation device in the fourteenth characteristic of the fifteenth characteristic, and comprises a notification unit for informing a user of abnormality; and the control unit is configured to inform a user of abnormality via the notification unit, when at least one of deterioration and failure in the electric power source is estimated or detected.

The gist of a seventeenth characteristic is that the seventeenth characteristic comprises a method for controlling an inhalation component generation device which comprises a load for vaporizing or atomizing an inhalation component source by electric power from an electric power source: wherein the method comprises a step for converting an analog voltage value of the electric power source to a digital voltage value by using a predefined correlation, and outputting the digital voltage value; a step for calibrating the correlation, based on change in the digital voltage value or the analog voltage value obtained during charging of the electric power source; and a step for controlling, based on the digital voltage value, supply of electric power from the electric power source to the load.

The gist of an eighteenth characteristic is that the eighteenth characteristic comprises a program that makes an inhalation component generation device perform the method in the seventeenth characteristic.

DESCRIPTION OF EMBODIMENTS

Figure 1:
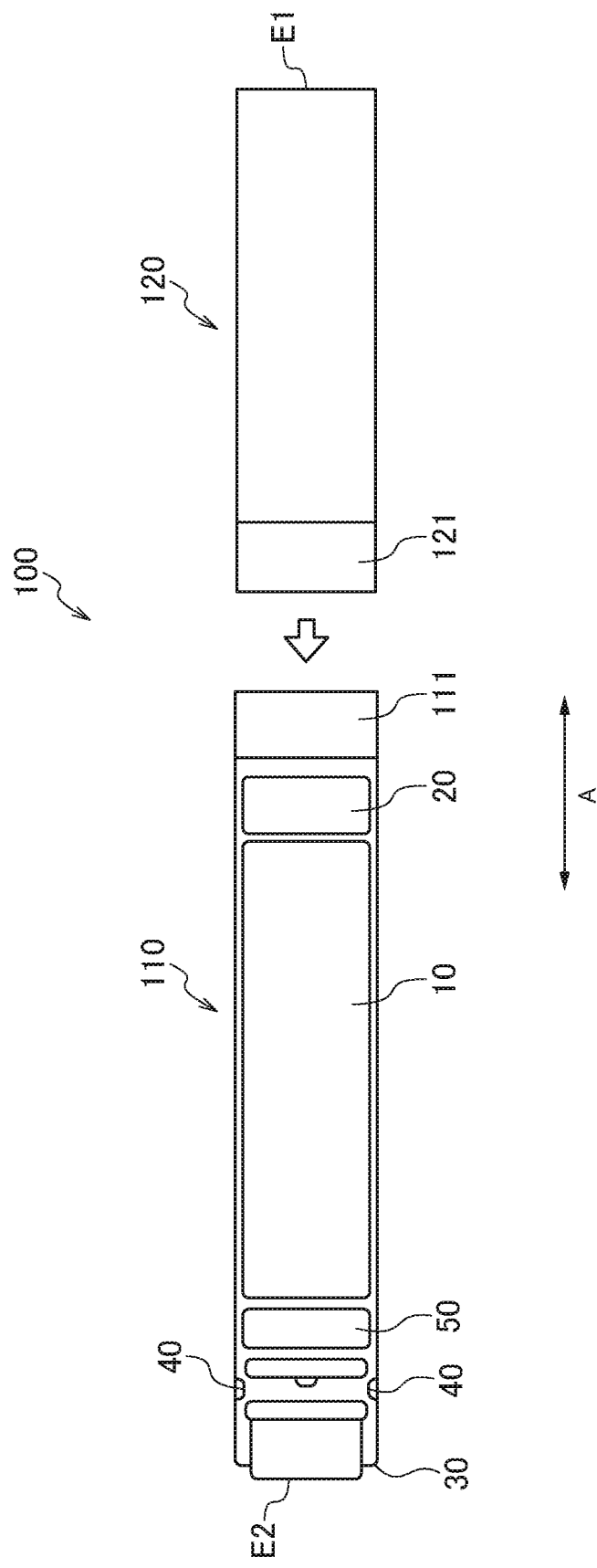
FIG. 1 is a schematic figure of an inhalation component generation device according to an embodiment.

In the following description, embodiments will be explained. In this regard, in the following descriptions of the figures, the same or similar symbols are assigned to the same or similar parts. It should be reminded that the figures are drawn in a schematic manner, so that ratios between respective sizes and so on may be different from actual ratios and so on.

Thus, specific sizes and so on should be judged by taking the following description into consideration. Further, it is a matter of course that, in the figures, relationship and ratios between sizes in one figure may be different from those in other figures.

Summary of Disclosure

It has been known that the full-charge voltage and the discharge cutoff voltage of a chargeable/dischargeable electric power source are determined theoretically (electrochemically) based on kinds of active materials and electrolytes which are components of the electric power source. Thus, if a voltage sensor, which outputs a voltage value of an electric power source, can be precisely manufactured and incorporated, an error between a true value of a voltage of an electric power source and an output value of the voltage sensor rarely occurs. However, in actuality, an error between a true value of a voltage of an electric power source and an output value of a voltage sensor may occur, due to various factors such as a measurement error of the voltage sensor, an error generated when an analog voltage value is converted to a digital voltage value, change in a resistance value of an electric circuit, deterioration of the electric power source, a production error, and so on.

An inhalation component generation device according to a construction comprises a load for vaporizing or atomizing an inhalation component source by electric power from an electric power source, and a control unit. The control unit comprises a voltage sensor for converting an analog voltage value of the electric power source to a digital voltage value by using a predefined correlation, and outputting the digital voltage value, and a power control unit for controlling, based on the digital voltage value, supply of electric power from the electric power source to the load. The control unit is configured to be able to calibrate the correlation, based on change in the digital voltage value or the analog voltage value obtained during charging of the electric power source.

A method for controlling an inhalation component generation device according to a construction relates to a method for controlling an inhalation component generation device which comprises a load for vaporizing or atomizing an inhalation component source by electric power from an electric power source. The method comprises a step for converting an analog voltage value of the electric power source to a digital voltage value by using a predefined correlation, and outputting the digital voltage value; a step for calibrating the correlation, based on change in the digital voltage value or the analog voltage value obtained during charging of the electric power source; and a step for controlling, based on the digital voltage value, supply of electric power from the electric power source to the load.

According to the present construction, an error included in a digital voltage value outputted by the voltage sensor can be reduced, since the correlation between the analog voltage value and the digital voltage value in the voltage sensor is calibrated based on change in the analog voltage value or the digital voltage value obtained during charging of the electric power source.

Further, the correlation used in the voltage sensor can be calibrated by using the analog voltage value and the digital voltage value of the voltage sensor. Thus, for example, without using a different sensor for monitoring the state of the voltage sensor, precision of the digital voltage value outputted by the voltage sensor can be improved.

First Embodiment (Inhalation Component Generation Device)

Figure 2:
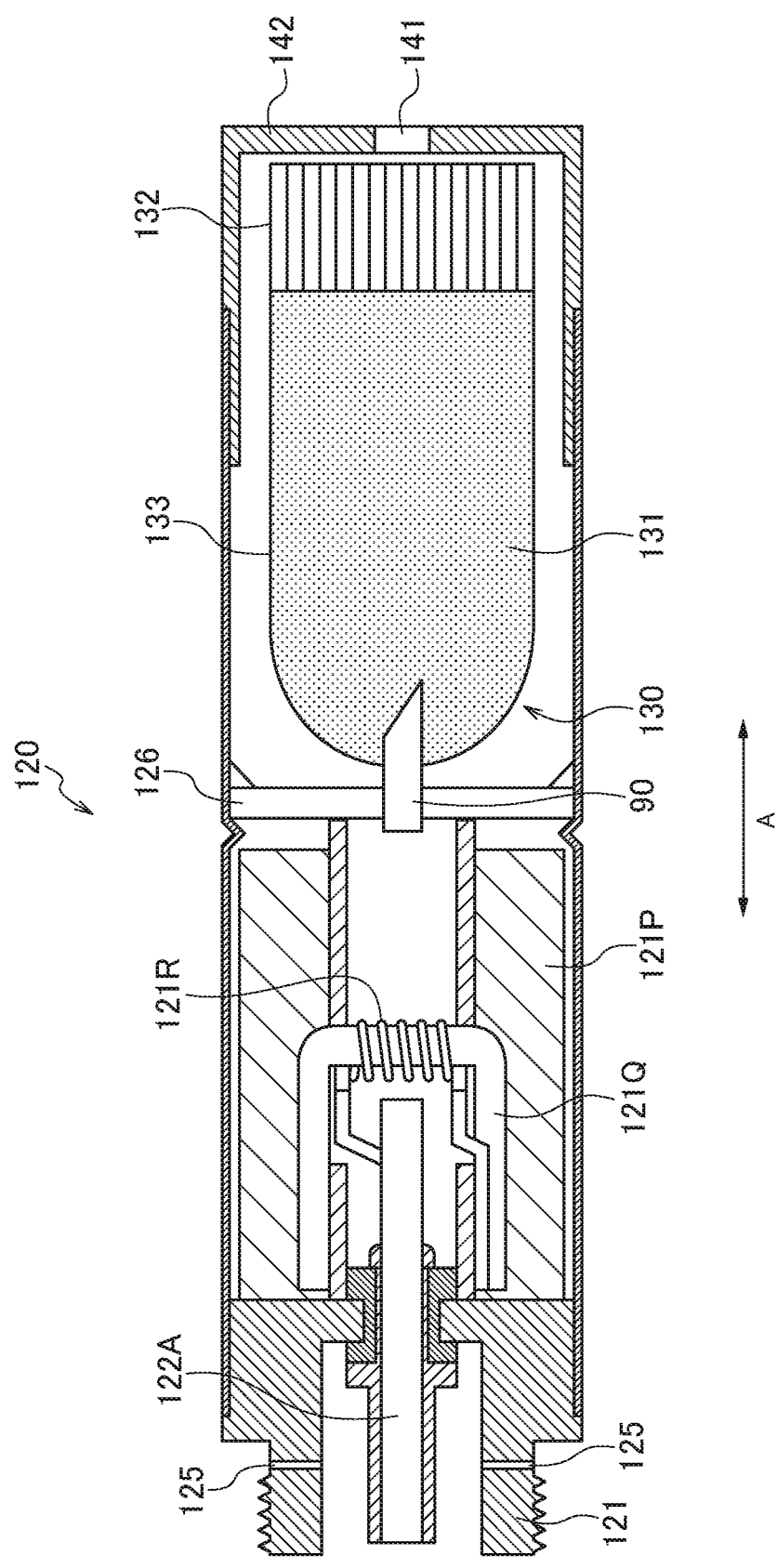
FIG. 2 is a schematic figure of an atomizing unit according to an embodiment.
Figure 3:
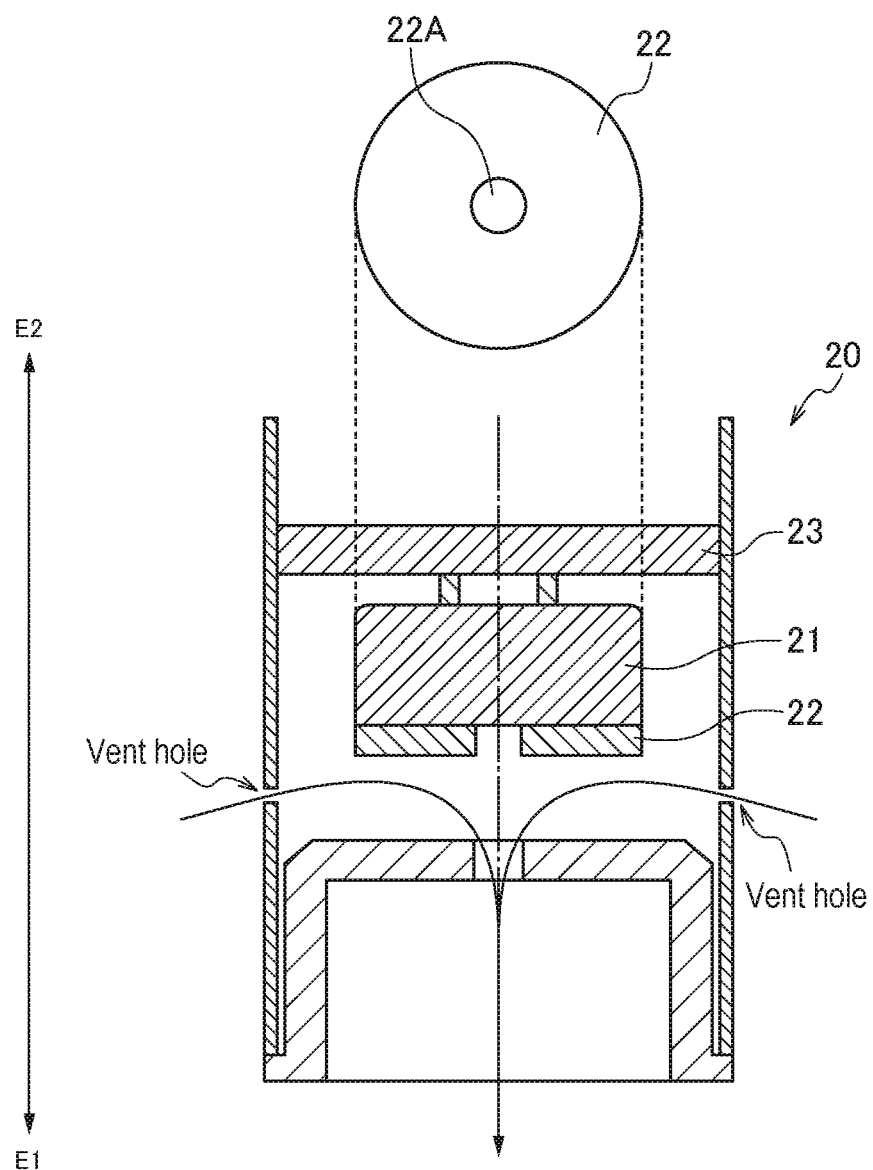
FIG. 3 is a schematic figure showing an example of a construction of an inhalation sensor according to an embodiment.
Figure 4:
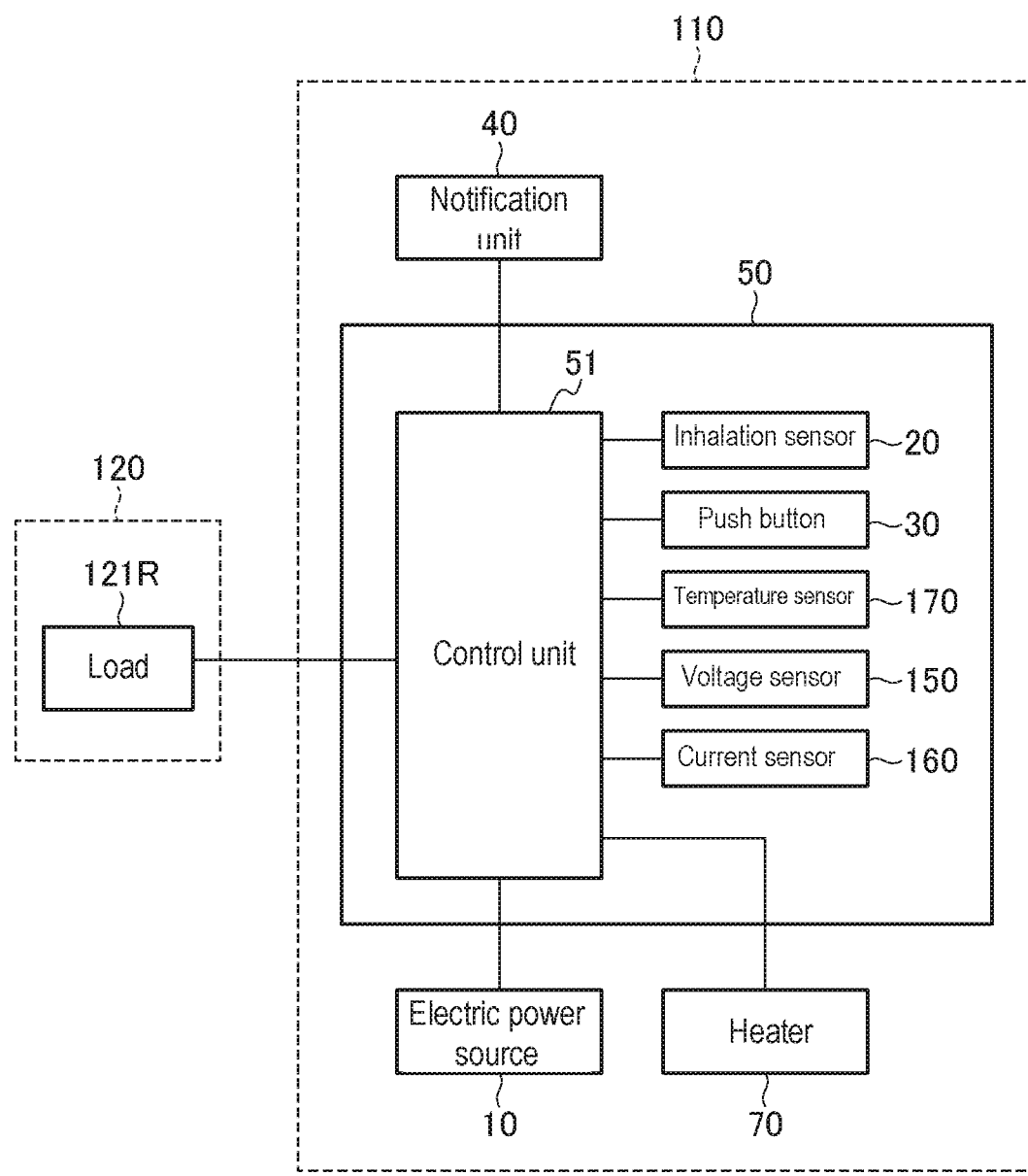
FIG. 4 is a block diagram of an inhalation component generation device.
Figure 5:
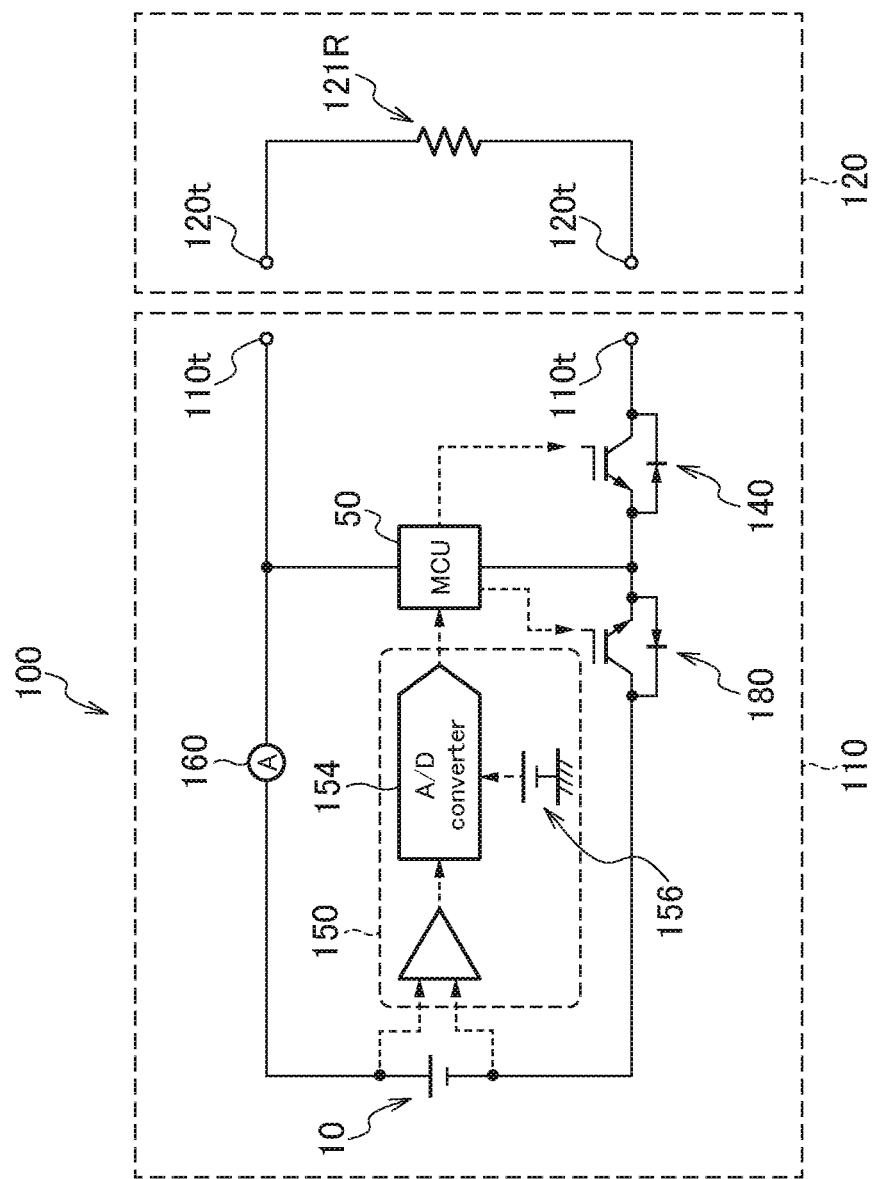
FIG. 5 is a figure showing electric circuits of an atomizing unit and an electric equipment unit.
Figure 6:
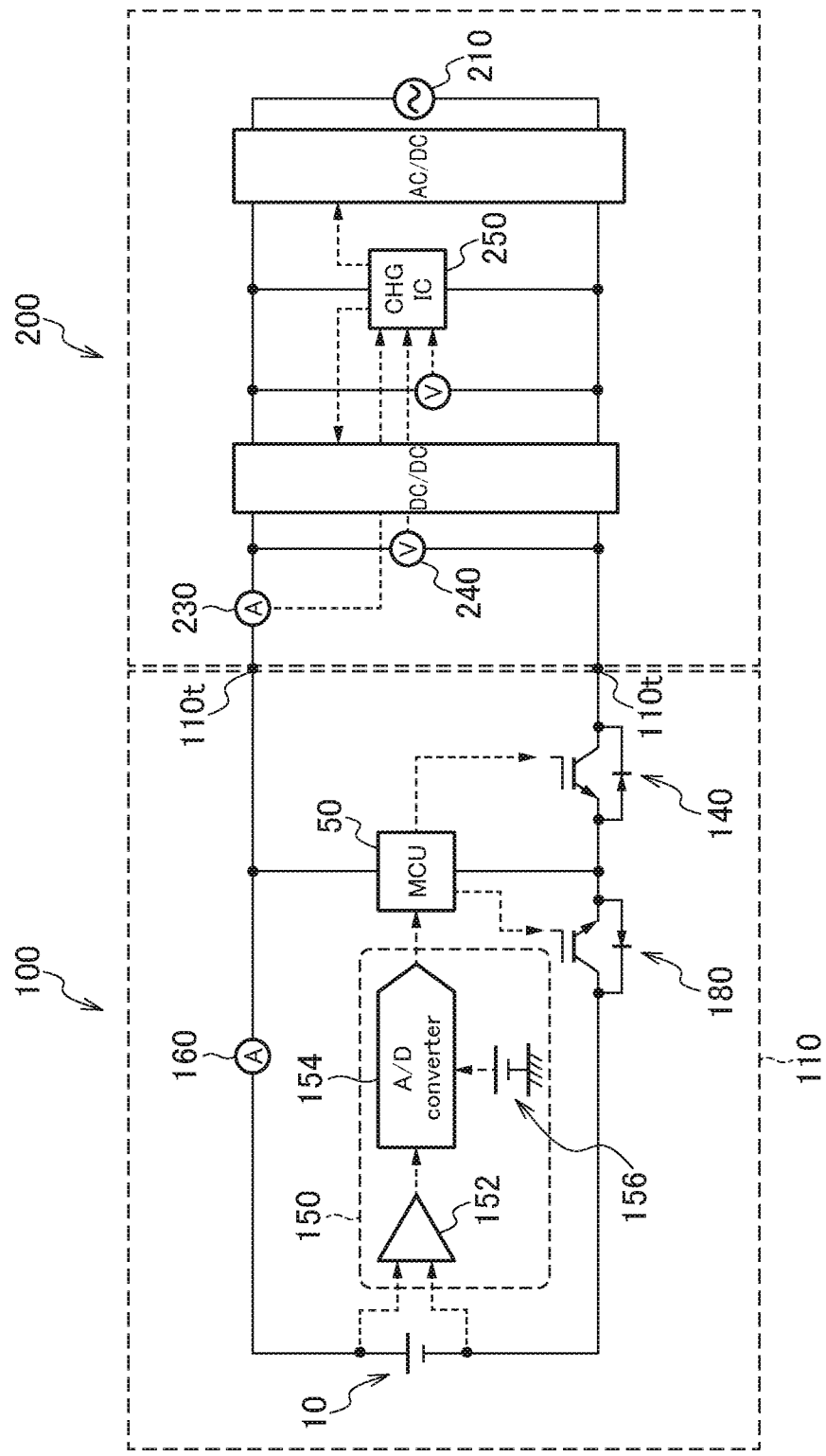
FIG. 6 is a figure showing electric circuits of a charger and an electric equipment unit in a state that the charger is being connected.

In the following description, an inhalation component generation device according to a first embodiment will be explained. FIG. 1 is an exploded view showing an inhalation component generation device according to an embodiment. FIG. 2 is a figure showing an atomizing unit according to an embodiment. FIG. 3 is a schematic figure showing an example of a construction of an inhalation sensor according to an embodiment. FIG. 4 is a block diagram showing an electrical construction of an inhalation component generation device. FIG. 5 is a figure showing electric circuits of an atomizing unit and an electric equipment unit. FIG. 6 is a figure showing electric circuits of a charger and an electric equipment unit in a state that the charger is being connected.

The inhalation component generation device 100 may be a non-burning-type flavor inhaler for inhaling an inhalation component (a fragrance-inhaling-taste component) without a burning process. The inhalation component generation device 100 may have a shape that extends in a predetermined direction A that is a direction toward a suction-opening end E1 from a non-suction-opening end E2. In the above case, the inhalation component generation device 100 may comprise one end E1 having a suction opening 141 for inhaling an inhalation component, and the other end E2 positioned opposite to the suction opening 141.

The inhalation component generation device 100 may comprise an electric equipment unit 110 and an atomizing unit 120. The atomizing unit 120 is constructed to be attachable/detachable to/from the electric equipment unit 110 via mechanical connection parts 111 and 121. When the atomizing unit 120 and the electric equipment unit 110 are mechanically connected to each other, a load 121R, which will be explained later, in the atomizing unit 120 is electrically connected, via electric connection terminals 110t and 120t, to an electric power source 10 installed in the electric equipment unit 110. That is, the electric connection terminals 110t and 120t construct a connection part which can electrically connect/disconnect the load 121R to/from the electric power source 10.

The atomizing unit 120 comprises an inhalation component source that is to be inhaled by a user, and the load 121R which vaporizes or atomizes the inhalation component source by electric power from the electric power source 10. The inhalation component source may comprise an aerosol source which generates aerosol and/or a flavor source which generates a flavor component.

The load 121R may be an element which can generate aerosol and/or a flavor component from an aerosol source and/or a flavor source by receiving electric power. For example, the load 121R may be a heater element such as a heater, or an element such as an ultrasonic generator. Examples of the heater elements that can be listed are a heating resistor, a ceramic heater, an induction-heating-type heater, and so on.

In the following description, a more detailed example of the atomizing unit 120 will be explained with reference to FIG. 1 and FIG. 2. The atomizing unit 120 may comprise a reservoir 121P, a wick 121Q, and the load 121R. The reservoir 121P may be constructed to store an aerosol source or a flavor source in a liquid form. For example, reservoir 121P may be a porous body constructed by use of material such as a resin web or the like. The wick 121Q may be a liquid holding member for drawing the aerosol source or the flavor source from the reservoir 121P by using a capillary phenomenon. For example, the wick 121Q may be constructed by use of a glass fiber, a porous ceramic, or the like.

The load 121R atomizes the aerosol source held in the wick 121Q or heats the flavor source held in the wick 121Q. The load 121R is constructed, for example, by use of a resistance heating element (for example, a heating wire) which is wound around the wick 121Q.

The air taken from an inflow hole 122A passes through a space near the load 121R in the atomizing unit 120. The inhalation component generated by the load 121R flows, together with the air, in the direction toward the suction opening.

The aerosol source may be liquid at normal temperature. For example, polyhydric alcohol such as glycerin, propylene glycol, or the like, or water or the like may be used as the aerosol source. The aerosol source itself may comprise a flavor source. Alternatively, the aerosol source may comprise a tobacco raw material or an extract originated from a tobacco raw material, which releases a fragrance-inhaling-taste component when it is heated.

With respect to the above embodiment, an example relating to an aerosol source, which is liquid at normal temperature, has been explained; however, it is possible to use, in place of the above aerosol source, an aerosol source which is solid at normal temperature.

The atomizing unit 120 may comprise a flavor unit (cartridge) 130 which is constructed to be exchangeable. The flavor unit 130 comprises a cylindrical body 131 for storing a flavor source. The cylindrical body 131 may comprise a membrane member 133 and a filter 132. The flavor source may be arranged in a space constructed by the membrane member 133 and the filter 132.

The atomizing unit 120 may comprise a breaking unit 90. The breaking unit 90 is a member for breaking a part of the membrane member 133 in the flavor unit 130. The breaking unit 90 may be held by a partition member 126 which separates the atomizing unit 120 from the flavor unit 130. For example, the partition member 126 comprises a polyacetal resin. The breaking unit 90 is a cylindrical hollow needle. By piercing the membrane member 133 with a tip of the hollow needle, an air flowing path, that makes the atomizing unit 120 and the flavor unit 130 be communicated with each other to communicate air, is formed. In this regard, it is preferable that a mesh, which has a roughness that does not allow the flavor source passing through the mesh, be formed in the inside of the hollow needle.

According to an example of a preferred embodiment, the flavor source in the flavor unit 130 adds a fragrance-inhaling-taste component to aerosol generated by the load 121R in the atomizing unit 120. The flavor added by the flavor source to the aerosol is conveyed to the suction opening of the inhalation component generation device 100. In this manner, the inhalation component generation device 100 may comprise plural inhalation component sources. Alternatively, the inhalation component generation device 100 may comprise a single inhalation component source.

The flavor source in the flavor unit 130 may be solid at normal temperature. For example, the flavor source comprises a raw-material piece of plant material which provides aerosol with a fragrance-inhaling-taste component. Regarding a raw-material piece which is a component of the flavor source, shredded tobacco or a product, which is made by processing tobacco material such as tobacco raw material and has a granular form, may be used as the raw-material piece. Alternatively, the flavor source may comprise a product which is made by processing tobacco material and has a sheet form. Further, the raw-material piece, which is a component of the flavor source, may comprise a plant other than tobacco (for example, mint, a herb, and so on). The flavor source may be provided with flavor such as menthol or the like.

The inhalation component generation device 100 may comprise a mouthpiece 142 which has a suction opening 141 for allowing a user to inhale an inhalation component. The mouthpiece 142 may be constructed in such a manner that it is attachable/detachable to/from the atomizing unit 120 or the flavor unit 130, or it is integrated with it to be inseparable.

The electric equipment unit 110 may comprise an electric power source 10, a notification unit 40, and control unit 50. The electric power source 10 stores electric power required for operation of the flavor inhaler 100. The electric power source 10 may be attachable/detachable to/from the electric equipment unit 110. The electric power source 10 may be a rechargeable battery such as a lithium-ion secondary battery, for example.

The control unit 50 may comprise a control section 51, for example, such as a microcomputer, an inhalation sensor 20, and a push button 30. Further, the inhalation component generation device 100 may comprise, as necessary, a voltage sensor 150, a current sensor 160, and a temperature sensor 170. In response to output values from the voltage sensor 150, the current sensor 160, and the temperature sensor 170, the control section 51 performs various types of control required for operation of the inhalation component generation device 100. For example, the control section 51 may have a construction as an electric power control section for performing control of electric power from the electric power source 10 to the load 121R.

When the atomizing unit 120 is connected to the electric equipment unit 110, the load 121R in the atomizing unit 120 is electrically connected to the electric power source 10 in the electric equipment unit 110 (refer to FIG. 5).

The inhalation component generation device 100 may comprise a switch 140 for electrical connection/disconnection between the load 121R and the electric power source 10. The switch 140 is opened/closed by the control unit 50. The switch 140 may comprise a MOSFET, for example.

If the switch 140 is turned on, electric power is supplied from the electric power source 10 to the load 121R. On the other hand, if the switch 140 is turned off, supply of electric power from the electric power source 10 to the load 121R is stopped. Turning on/off of the switch 140 is controlled by the control unit 50.

The control unit 50 may comprise a request sensor which can output a signal for requesting operation of the load 121R. The request sensor may be a push button 30 which is to be pushed by a user, or an inhalation sensor 20 for detecting an inhaling action of a user, for example. The control unit 50 obtains an operation request signal to the load 121R, and generates an instruction for operating the load 121R. In a tangible example, the control unit 50 outputs, to the switch 140, an instruction for operating the load 121R, and the switch 140 is turned on in response to the instruction. In this manner, the control unit 50 is configured to control supply of electric power from the electric power source 10 to the load 121R. If electric power is supplied from the electric power source 10 to the load 121R, the inhalation component source is vaporized or atomized by the load 121R.

Further, the inhalation component generation device 100 may comprise, as necessary, a stopping unit 180 for blocking or reducing charging current to the electric power source 10. The stopping unit 180 may comprise a MOSFET switch, for example. By making the stopping unit 180 to be OFF, the control unit 50 can forcibly block or reduce charging current to the electric power source 10, even if the electric equipment unit 110 is being connected to a charger 200. In this regard, even if a dedicated stopping unit 180 is not installed, charging current to the electric power source 10 may be forcibly blocked or reduced by turning off the switch 140 by the control unit 50.

The voltage sensor 150 may be configured to output a voltage value of the electric power source 10. The control unit 50 can obtain an output value of the voltage sensor 150. That is, the control unit 50 is configured to be able to obtain a voltage value of the electric power source 10.

The current sensor 160 may be configured to be able to detect the quantity of current flown out of the electric power source 10, and the quantity of current flown into the electric power source 10. The temperature sensor 170 may be configured to be able to output temperature of the electric power source 10, for example. The control unit 50 is configured to be able to obtain outputs from the voltage sensor 150, the current sensor 160, and the temperature sensor 170. The control unit 50 performs various types of control by use of the above outputs.

The inhalation component generation device 100 may comprise, as necessary, a heater 70 for heating the electric power source 10. The heater 70 may be installed in a position near the electric power source 10, and is configured to be able to operate in response to an instruction from the control unit 50.

The inhalation sensor 20 may be configured to output an output value that changes according to inhaling from the suction opening. Specifically, the inhalation sensor 20 is a sensor for outputting a value (for example, a voltage value or a current value) that changes according to the quantity of the flow of air that is sucked in the direction from the non-suction-opening side to the suction-opening side (that is, the puff action performed by a user). Examples of such sensors that can be listed are a condenser microphone sensor, a publicly known flow sensor, and so on.

FIG. 3 shows a tangible example of the inhalation sensor 20. The inhalation sensor 20 exemplified in FIG. 3 comprises a sensor main body 21, a cover 22, and a circuit board 23. The sensor main body 21 comprises a capacitor, for example. The electric capacitance of the sensor main body 21 changes according to vibration (pressure) generated by air sucked from an air introducing hole 125 (that is, the air sucked in the direction from the non-suction-opening side to the suction-opening side). The cover 22 is installed on the sensor main body 21 at the suction-opening side thereof, and has an opening 22A. By installing the cover 22 having the opening 22A, the electric capacitance of the sensor main body 21 is made in such a manner that it is more easily changeable, so that the response characteristic of the sensor main body 21 is improved. The circuit board 23 outputs a value (in this case, a voltage value) representing the electric capacitance of the sensor main body 21 (the capacitor).

The inhalation component generation device 100, more specifically, the electric equipment unit 110, may be constructed in such a manner that it is connectable to the charger 200 for charging the electric power source 10 in the electric equipment unit 110 (refer to FIG. 6). When the charger 200 is connected to the electric equipment unit 110, the charger 200 is electrically connected to the electric power source 10 in the electric equipment unit 110.

The electric equipment unit 110 may comprise a judgment unit for making judgment as to whether the charger 200 is being connected. For example, the judgment part may be a means for making judgment as to whether or not the charger 200 is being connected, based on change in a potential difference between a pair of electric terminals to which the charger 200 is connected. The judgment means is not limited to the above means, that is, the judgment means can be any means that can make judgment as to whether or not the charger 200 is being connected.

The charger 200 comprises an external electric power source 210 for charging the electric power source 10 in the electric equipment unit 110. The pair of electric terminals 110t, which are used for electrically connecting the charger 200, of the electric equipment unit 110 may also serve as a pair of electric terminals, which are used for electrically connecting the load 121R, of the electric equipment unit 110.

In the case that the external electric power source 210 is an AC power source, the charger 200 may comprise an inverter for converting alternating current to direct current. The charger 200 may comprise a processor 250 for controlling charging to the electric power source 10. Further, the charger 200 may comprise, as necessary, an ammeter 230 and/or a voltmeter 240. The ammeter 230 obtains charging current that is supplied from the charger 200 to the electric power source 10. The voltmeter 240 obtains a voltage between a pair of electric terminals to which the charger 200 is connected. The processor 250 in the charger 200 controls, by use of output values from the ammeter 230 and/or the voltmeter 240, charging with respect to the electric power source 10. In this regard, the charger 200 may further comprise a voltage sensor for obtaining a DC voltage of output of an inverter, and a converter which can step-up and/or step-down a DC voltage of output of an inverter.

For the purpose to simplify the structure of the inhalation component generation device 100, the processor 250 in the charger 200 may be configured in such a manner that it cannot communicate with the control unit 50 in the electric equipment unit 110. That is, a communication terminal for communication between the processor 250 in the charger 200 and the control unit 50 is not necessary. In other words, the only electric terminals included in an interface for connection to the charger 200, in the electric equipment unit 110, are two, specifically, one for a main positive bus line and the other for a main negative bus line.

The notification unit 40 outputs a notice for informing a user of various kinds of information. The notification unit 40 may be a light emitting element such as an LED, for example. Alternatively, the notification unit 40 may be an element which generates sound, or a vibrator.

The notification unit 40 is configured to inform a user of, at least, a state wherein the remaining quantity of the electric power source 10 is not insufficient and a state wherein the remaining quantity of the electric power source 10 is insufficient, based on the voltage of the electric power source 10. For example, in the case that the remaining quantity of the electric power source 10 is insufficient, the notification unit 40 outputs a notice that is different from a notice outputted when the remaining quantity of the electric power source 10 is not insufficient. The state that the remaining quantity of the electric power source 10 is insufficient is determined, for example, by judging that the voltage of the electric power source 10 is that near a discharge cutoff voltage.

(Electric Power Supplying Mode)

Figure 7:
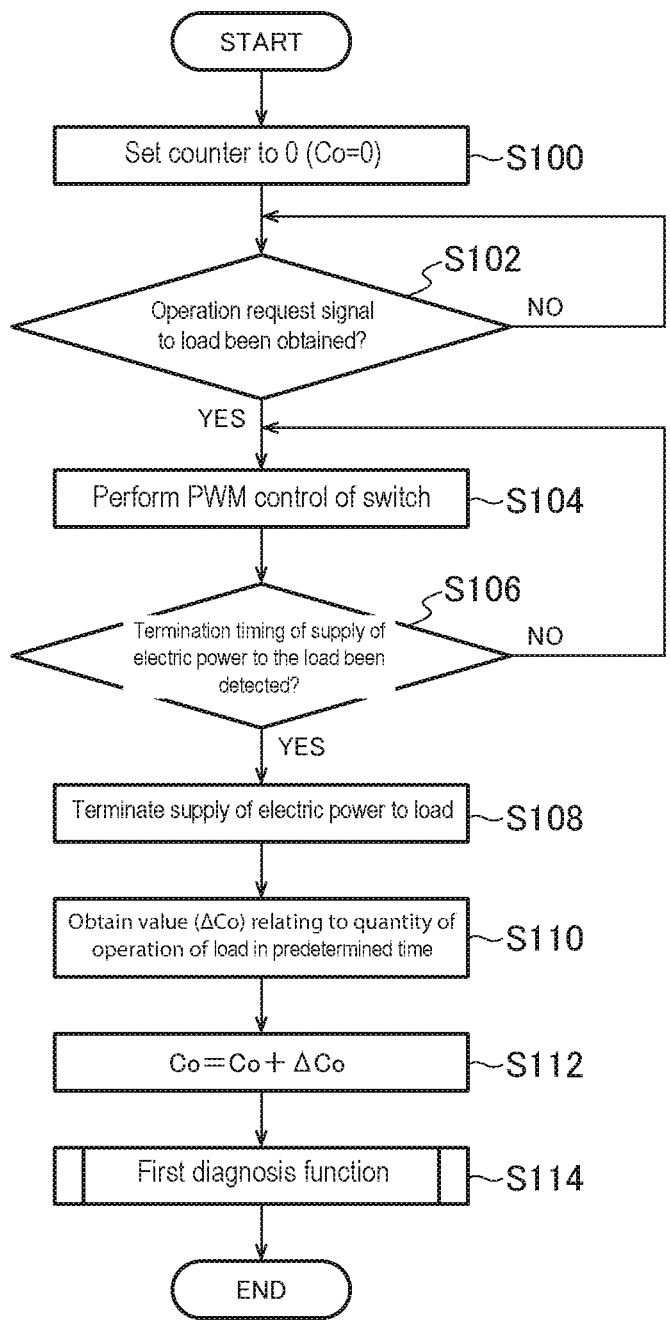
FIG. 7 is a flow chart showing an example of a control method when the inhalation component generation device is in an electric power supplying mode.

FIG. 7 is a flow chart showing a control method in an electric power supplying mode according to an embodiment. The electric power supplying mode is a mode wherein electric power can be supplied from the electric power source 10 to the load 121R. The electric power supplying mode can be executed in the case that at least the atomizing unit 120 is connected to the electric equipment unit 110.

The control unit 50 sets a counter (Co), which measures a value relating to the quantity of operation of the load, to "0" (step S100), and makes judgment as to whether an operation request signal to the load 121R has been received (step S102). The operation request signal may be a signal that is obtained form the inhalation sensor 20, when an inhalation action by a user is detected by the inhalation sensor 20. That is, the control unit 50 may perform PWM (Pulse Width Modulation) control with respect to the switch 140 (step S104), when an inhalation action by a user is detected by the inhalation sensor 20. Alternatively, the operation request signal may be a signal that is obtained from the push button 30, when a state that the push button 30 has been pressed is detected. That is, the control unit 50 may perform PWM control with respect to the switch 140 (step S104), when pressing down of the push button by a user is detected. In this regard, in step S104, PFM (Pulse Frequency Modulation) control may be performed instead of the PWM control. The DUTY ration in the PWM control and the switching frequency in the PFM control may be adjusted by use of various parameters such as the voltage of the electric power source 10 obtained by the voltage sensor 150, and so on.

As a result that the PWM control with respect to the switch 140 is performed by the control unit 50, aerosol is generated.

The control unit 50 makes judgment as to whether termination timing of supply of electric power to the load 121R is detected (step S106). The control unit 50 terminates supply of electric power to the load when the termination timing is detected (step S108). After terminating supply of electric power to the load (step S108), the control unit 50 obtains a value (ΔCo) relating to the quantity of operation of the load 121R (step S110). The value (ΔCo), that relates to the quantity of operation of the load 121R and has been obtained herein, is a value during steps S104-S108. The value (ΔCo) relating to the quantity of operation of the load 121R may be, for example, the quantity of electric power supplied to the load 121R during predetermined time, i.e., during steps S104-S108, operation time of the load 121R, or the consumed quantity of an inhalation component source consumed during the predetermined time.

Next, an accumulated value "Co=Co+ΔCo" of values relating to the quantity of operation of the load 121R is obtained (step S 112). Thereafter, the control unit 50 executes, as necessary, a first diagnosis function (step S114).

The termination timing of supply of electric power to the load 121R may be the timing when completion of manipulation for using the load 121R is detected by the inhalation sensor 20. For example, the termination timing of supply of electric power to the load 121R may be the timing when termination of an inhalation action of a user is detected. Alternatively, the termination timing of supply of electric power to the load 121R may be the timing when releasing of the push button 30 from a pressed-down state is detected. Further, the termination timing of supply of electric power to the load 121R may be the timing when the state that predetermined cutoff time has been elapsed, since starting of supply of electric power to the load 121R, is detected. The predetermined cutoff time may be set in advance, based on a period required for performing a single inhalation action by a general user. For example, the predetermined cutoff time may be within the range between 1-5 seconds, preferably, 1.5-3 seconds, and, more preferably, 1.5-2.5 seconds.

In the case that the control unit 50 did not detect the termination timing of supply of electric power to the load 121R, the control unit 50 again performs the PWM control with respect to the switch 140, and continues supply of electric power to the load 121R (step S104). Thereafter, when the control unit 50 has detected the termination timing of supply of electric power to the load 121R, the control unit 50 obtains a value relating to the quantity of operation of the load 121R (step S110), and derives an accumulated value of the values relating to the quantity of operation of the load 121R (step S 112).

Thus, at the time that supply of electric power to the load is terminated (step S108), the control unit 50 can obtain a value relating to the quantity of operation of the load 121R, from acquisition of the operation request signal to the load to the termination timing of supply of electric power to the load 121R, i.e., in a single puff action. The quantity of operation of the load 121R in a single puff action may be the quantity of electric power supplied to the load 121R in a single puff action, for example. Alternatively, the quantity of operation of the load 121R in a single puff action may be the operation time of the load 121R in a single puff action, for example. The operation time of the load 121R may be the sum total of power pulses (refer to FIG. 8 also) supplied to the load 121R in a single puff action, or the time required for a single puff action, i.e., the time from acquisition of the operation request signal to the load 121R to detection of the termination timing of supply of electric power to the load 121R. Further, the quantity of operation of the load 121R in a single puff action may be the consumed quantity of an inhalation component source consumed in a single puff action. The consumed quantity of the inhalation component source can be estimated from the quantity of electric power supplied to the load 121R, for example. Further, in the case that the inhalation component source is liquid, the consumed quantity of the inhalation component source can be obtained by a sensor which measures weight of the inhalation component source remaining in a reservoir, or measures height of a liquid surface of the inhalation component source. Further, the quantity of operation of the load 121R in a single puff action may be temperature of the load 121R, for example, the maximum temperature of the load 121R in a single puff action, or the quantity of heat generated by the load 121R. The temperature and the quantity of heat with respect to the load 121R can be obtained or estimated by using a temperature sensor, for example.

Figure 8:
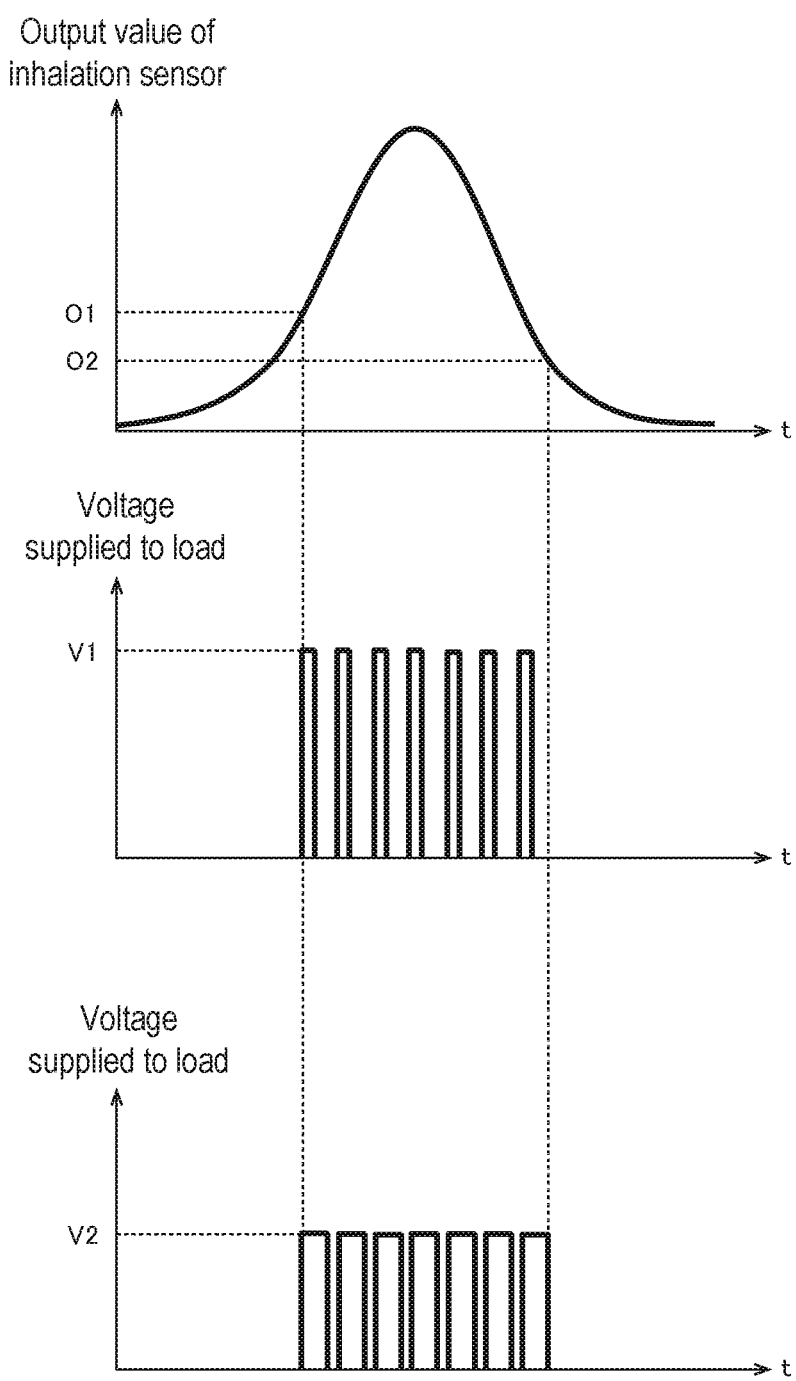
FIG. 8 is a graph showing an example of control of the quantity of electric power supplied from an electric power source to a load.

FIG. 8 is a graph showing an example of control of the quantity of electric power supplied from the electric power source 10 to a load 121R. FIG. 8 shows relationship between output values of the inhalation sensor 20 and voltages supplied to the load 121R.

The inhalation sensor 20 is configured to output an output value that varies according to inhaling from the suction opening 141. Although the output value of the inhalation sensor 20 may be a value corresponding to the speed of flow or the quantity of flow of gas in a flavor inhaler, as shown in FIG. 8 (for example, a value representing change in the pressure in the inhalation component generation device 100), the output value is not limited thereto.

In the case that the inhalation sensor 20 outputs an output value in response to inhalation, the control unit 50 may be configured to detect inhalation in response to an output value of the inhalation sensor 20. For example, the control unit 50 may be configured to detect an inhalation action of a user, when the output value of the inhalation sensor 20 becomes a value equal to or greater than a first predetermined value 01. Thus, the control unit 50 may judge that an operation request signal to the load 121R is obtained (step S102), when the output value of the inhalation sensor 20 has become a value equal to or greater than the first predetermined value 01. On the other hand, the control unit 50 may judge that termination timing of supply of electric power to the load 121R is detected (step S106), when the output value of the inhalation sensor 20 has become a value equal to or less than a second predetermined value 02. In this manner, the control unit 50 may be configured to be able to derive, based on output from the inhalation sensor 20, a value relating to the quantity of operation of the load 121R, for example, the total time used for supplying electric power to the load 121R in a single puff action. More specifically, the control unit 50 is configured to be able to derive, based on at least one of the detected inhalation period or the quantity of inhalation, a value relating to the quantity of operation of the load 121R.

In this regard, the control unit 50 is configured to detect inhalation, only when an absolute value of an output value of the inhalation sensor 20 is equal to or greater than the first predetermined value (a predetermined threshold value) 01. Thus, it becomes possible to suppress undesired operation of the load 121R due to noise in the inhalation sensor 20. Further, since the second predetermined value 02 for detecting termination timing of supply of electric power to the load 121R is a value used for performing transition from a state wherein the load 121R has already been operated to a state wherein it is not operated, it may be smaller than the first predetermined value 01. This is because a malfunction of the inhalation sensor 20 due to picking up of noise thereby, i.e., transition from a state wherein the load 121R is not being operated to a state wherein it is operated, will never occur.

Further, the control unit 50 may comprise a power control unit for controlling the quantity of electric power supplied from the electric power source 10 to the load 121R. For example, the power control unit adjusts the quantity of electric power supplied from the electric power source 10 to the load 121R, by performing pulse width modulation (PWM) control. A duty ratio relating to a pulse width may be a value less than 100%. It should be reminded that the power control unit may control the quantity of electric power supplied from the electric power source 10 to the load 121R, by performing pulse frequency modulation (PFM) control.

For example, in the case that the voltage value of the electric power source 10 is relatively high, the control unit 50 makes a pulse width of a voltage supplied to the load 121R be narrower (refer to the graph in the middle part of FIG. 8). For example, in the case that the voltage value of the electric power source 10 is relatively low, the control unit 50 makes a pulse width of a voltage supplied to the load 121R be wider (refer to the graph in the lower part of FIG. 8). Control of the pulse width can be realized by adjusting time from turning-on of the switch 140 to turning-off of the switch 140, for example. Since the voltage value of the electric power source 10 decreases as the quantity of charge in the electric power source decreases, the quantity of electric power may be adjusted according to the voltage value. If the control unit 50 performs the pulse width modulation (PWM) control as explained above, in both the case that the voltage value of the electric power source 10 is relatively high and the case that it is relatively low, the effective values of the voltages supplied to the load become similar to each other.

As explained above, it is preferable that the power control unit be configured to control the voltage applied to the load 121R, by use of the pulse width modulation (PWM) control wherein it has a duty cycle that becomes larger as the voltage value of the electric power source 10 becomes lower. As a result thereof, the quantity of aerosol generated during a puff action can be made approximately uniform, irrespective of the remaining quantity of the electric power source 10. More preferably, it is preferable that the power control unit be configured to control the duty ratio of the pulse width modulation (PWM) control in such a manner that the quantity of electric power per single pulse supplied to the load 121R is made be constant.

(First Diagnosis Function)

Figure 9:
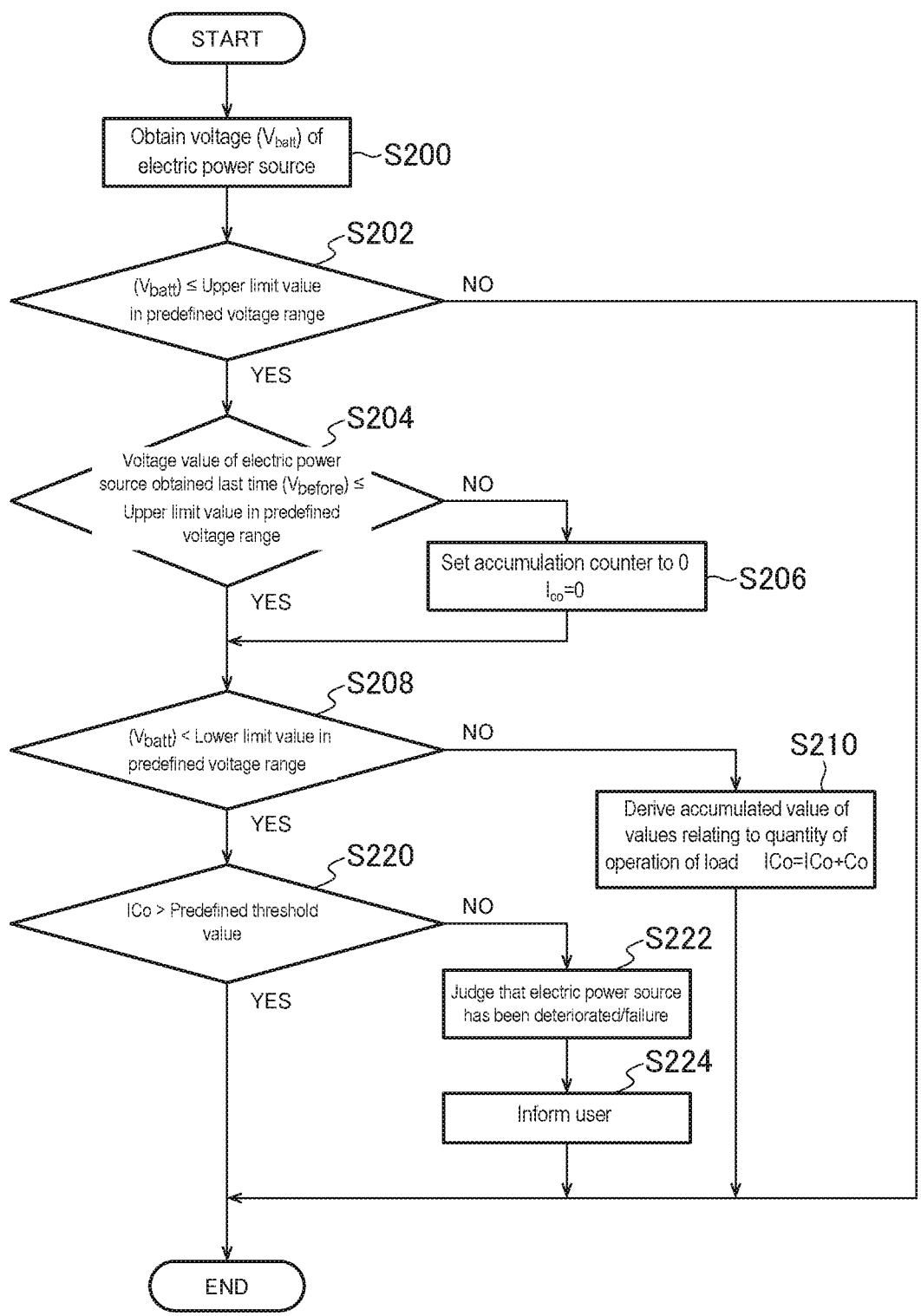
FIG. 9 is a figure showing an example of a flow chart of a first diagnosis process.
Figure 10:
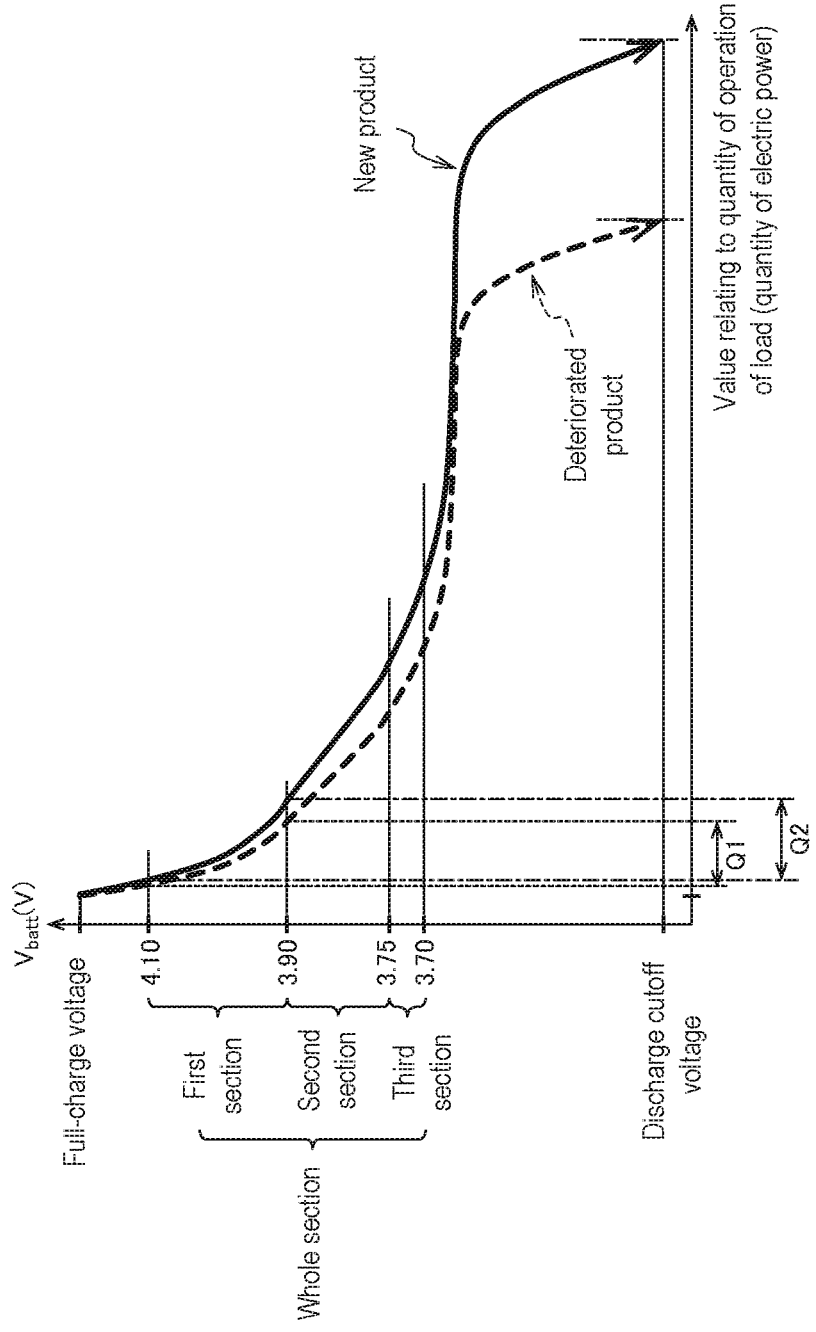
FIG. 10 is a figure for explaining a predefined voltage range in a first diagnosis function.

FIG. 9 shows an example of a flow chart of a first diagnosis function. The first diagnosis function is a process for estimating or detecting at least one of deterioration and failure in the electric power source 10, based on a value relating to the quantity of operation of the load 121R operated during a state that the voltage value of the electric power source 10 is in a predefined voltage range. FIG. 10 is a figure for explaining the predefined voltage range in the first diagnosis function.

Specifically, first, the control unit 50 obtains a voltage ($V_{batt}$) of the electric power source 10 (step S200). The voltage ($V_{batt}$) of the electric power source 10 can be obtained by using the voltage sensor 150. The voltage of the electric power source 10 may be an open circuit voltage (OCV, Open Circuit Voltage) that is obtained without electrically connecting the load 121R to the electric power source 10, or a closed circuit voltage (CCV, Closed Circuit Voltage) that is obtained in the state that the load 121R is being electrically connected to the electric power source 10. In this regard, it is preferable that the voltage of the electric power source 10 be defined by use of an open circuit voltage (OCV) rather than a closed circuit voltage (CCV), for eliminating effect due to voltage drop relating to electrical connection to the load 121R, change in internal resistance relating to discharging, and change in temperature. The open circuit voltage (OCV) is obtained by obtaining the voltage of the electric power source 10 in the state that the switch 140 is being turned off. In this regard, even if the open circuit voltage (OCV) is not obtained by use of the voltage sensor 150, the open circuit voltage (OCV) may be estimated from the closed circuit voltage (CCV) by using publicly-known various methods.

Next, the control unit 50 makes judgment as to whether the obtained voltage of the electric power source 10 is equal to or less than the upper limit value in the predefined voltage range (step S202). If the voltage of the electric power source 10 is greater than the upper limit value in the predefined voltage range, the process is terminated without estimating or detecting deterioration and failure in the electric power source 10.

If the voltage of the electric power source 10 is equal to or less than the upper limit value in the predefined voltage range, judgment as to whether the voltage value of the electric power source obtained last time, i.e., obtained in the last-time puff action, is equal to or less than the upper limit value in the above-explained predefined voltage range is made (step S204). If the voltage value of the electric power source 10 obtained last time, i.e., obtained in the last-time puff action, is greater than the upper limit value in the above-explained predefined voltage range, it can be judged that the voltage value of the electric power source 10 has become that equal to or less than the upper limit value in the above-explained predefined voltage range for the first time, as a result of the most recent puff action. In such a case, an accumulation counter (ICo) for counting an accumulated value of values relating to the quantities of operation of the load 121R is set to "0" (step S206). After setting the accumulation counter (ICo) to "0," the process proceeds to following step S208.

If the voltage value of the electric power source obtained last time, i.e., obtained in the last-time puff action, is equal to or less than the upper limit value in the above-explained predefined voltage range (step S204), or if the accumulation counter (ICo) is set to "0" (step S206), judgment as to whether the voltage value of the electric power source 10 is less than the lower limit value in the predefined voltage range is made (step S208).

If the voltage value of the electric power source 10 is equal to or greater than the lower limit value in the predefined voltage range, an accumulated value "ICo=ICo+Co" of values relating to the quantity of operation of the load 121R is derived (Step S210). In this regard, "Co" is a value obtained, in an accumulated manner, in step S112 in FIG. 7. Thereafter, the process is terminated without estimating or detecting deterioration and failure in the electric power source 10.

After completing the above process, the control unit 50 waits, until an operation request signal to the load 121R is obtained again (step S102 in FIG. 7). After obtaining an operation request signal to the load 121R again, the control unit 50 derives a value (Co) relating to the quantity of operation of the load 121R in a single puff action, and starts the first diagnosis function S114 again.

In the first diagnosis function, if the voltage of the electric power source 10 is in the predefined voltage range, the control unit 50 adds up the value relating to the quantity of operation of the load 121R (step S210). As a result, the control unit 50 can obtain a value relating to the quantity of operation of the load 121R which is operated during a state that the obtained voltage of the electric power source 10 is in the predefined voltage range.

In step S208, if the voltage value of the electric power source 10 is less than the lower limit value in the predefined voltage range, judgment as to whether the value relating to the quantity of operation of the load 121R which is operated during a state that the obtained voltage of the electric power source 10 is in the predefined voltage range, i.e., the above-explained accumulated value of ICo, is greater than a predefined threshold value is made (step S220). If the above-explained accumulated value of ICo is greater than the predefined threshold value, it is judged that the electric power source 10 is normal, and the first diagnosis function is terminated.

If the above-explained accumulated value of ICo is equal to or less than the predefined threshold value, it is judged that the electric power source 10 is deteriorated or failed (step S220), and the control unit 50 informs, via the notification unit 40, a user of abnormality (step S224). The notification unit 40 can inform a user of deterioration or failure in the electric power source 10 by sound or vibration. Further, the control unit 50 may perform control to prevent supply of electric power to the load 121R as necessary, when it has judged that the electric power source 10 has deteriorated or it has failure. It should be reminded that, in the present embodiment, if it is judged that the voltage of the electric power source 10 is less than the lower limit value in the predefined voltage range (step S208), the value Co relating to the quantity of operation of the load 121R is not added to the accumulated value ICo of values relating to the quantity of operation of the load 121R. In other words, if step S208 is judged to be affirmative, step S210 is not executed. Instead thereof, if it is judged that the voltage of the electric power source 10 is less than the lower limit value in the predefined voltage range (step S208), the value Co relating to the quantity of operation of the load 121R may be added to the accumulated value ICo of values relating to the quantity of operation of the load 121R. In other words, even in the case that step S208 is judged to be affirmative, step S210 may be executed. In such a case, the above step, that is similar to step S210, may be executed before step S220.

As shown in FIG. 10, as deterioration of the electric power source 10 progresses, the voltage of the electric power source 10 rapidly decreases, along with increase in values relating to the quantity of operation of the load, for example, the quantity of electric power to the load 121R or the time of operation of the load 121R, or the like. Thus, the value relating to the quantity of operation of the load 121R, that is operated during a state that the voltage value of the electric power source 10 is in the predefined voltage range, decreases as deterioration of the electric power source progresses. The above matter is shown by the relationship "Q1<Q2" in FIG. 10. In this regard, Q1 in FIG. 10 is a value relating to the quantity of operation of the load 121R operated during a state that the voltage value of the electric power source 10 is in the predefined voltage range, in the case that the electric power source 10 is a deteriorated product. On the other hand, Q2 in FIG. 10 is a value relating to the quantity of operation of the load 121R operated during a state that the voltage value of the electric power source 10 is in the predefined voltage range, in the case that the electric power source 10 is a new product. Thus, as explained above, the control unit 50 can estimate or detect deterioration in the electric power source 10, based on the value relating to the quantity of operation of the load 121R operated during a state that the voltage value of the electric power source 10 is in the predefined voltage range. It should be reminded that, when failure has occurred in the electric power source 10, the voltage of the electric power source 10 rapidly decreases, along with increase in values relating to the quantity of operation of the load, for example, the quantity of electric power to the load 121R or the time of operation of the load 121R, or the like, similar to the case that the electric power source 10 has deteriorated. Thus, the control unit 50 can estimate or detect failure in the electric power source 10, based on the value relating to the quantity of operation of the load 121R operated during a state that the voltage value of the electric power source 10 is in the predefined voltage range. That is, the control unit 50 can estimate or detect at least one of deterioration and failure in the electric power source 10, based on the value relating to the quantity of operation of the load 121R operated during a state that the voltage value of the electric power source 10 is in the predefined voltage range.

The predefined threshold value used in step S220 may be defined in advance, according to the type of the electric power source 10, by performing experiment. The predefined threshold value is set to be lower than the value relating to the quantity of operation of the load 121R, wherein a new electric power source 10 is operable in the predefined voltage range.

As explained above, the value relating to the quantity of operation of the load 121R may be the quantity of electric power supplied to the load 121R, the operation time of the load 121R, or the consumed quantity of the inhalation component source, or the like.

In this regard, in the case that the pulse width modulation (PWM) control of the electric power supplied to the load 121R is performed based on the voltage of the electric power source 10 obtained by the voltmeter 150 as explained above, it is preferable that the value relating to the quantity of operation of the load 121R be operation time of the load 121R. In the above case, the operation time of the load 121R is time required for a single puff action i.e., time from acquisition of an operation request signal to the load 121R to detection of termination timing of supply of electric power to the load 121R. Since the quantity of electric power supplied to the load 121R per unit time is made approximately uniform by the pulse width modulation (PWM) control, the operation time of the load 121R is proportional to a total quantity of electric power supplied to the load 121R in the predefined voltage range. Thus, in the case that the pulse width modulation (PWM) control of the electric power supplied to the load 121R is performed, precise diagnosis of the electric power source 10 can be made by performing relatively simple control, by defining the value relating to the quantity of operation of the load 122R by the operation time of the load 121R.

In place of the above example, the value relating to the quantity of operation of the load 122R may be the number of times of operation of the load 121R operated during a state that the voltage is in the predefined voltage range. In the above case, steps S110 and S112 are unnecessary in the flow chart in FIG. 7. Then, in the flow chart in FIG. 9, the number of times that the voltage of the electric power source 10 has entered the predefined voltage range may be counted. Specifically, the expression "ICo=Ico+Co" may be replaced by "ICo=OCo+1" in step S210.

Further, in place of the above example, the value relating to the quantity of operation of the load 122R may be the number of times of replacement of the exchangeable cartridge including a flavor component source, for example, the flavor unit 130. In the inhalation component generation device 100 wherein it is necessary to replace, plural number of times, the cartridge during a period until the charged electric power has been exhausted, it is possible to use, as the value relating to the quantity of operation of the load 121R, the number of times that a cartridge is replaced by the other.

The control unit 50 may be configured in such a manner that it can change or correct the algorithm for estimating or detecting at least one of deterioration and failure in the electric power source 10, i.e., the algorithm for executing the first diagnosis function shown in FIG. 9, when the temperature of the electric power source 10 is lower than a first temperature threshold value. Specifically, it is preferable that the control unit 50 correct the predefined threshold value in step S220 to have a smaller value, and perform comparison in step S220 based on the corrected threshold value. The first temperature threshold value may be set within the range of 1 to 5 degrees Celsius, for example.

It has been known that the internal resistance (impedance) of the electric power source 10 increases, in the case that the temperature of the electric power source 10 is low. As a result, even in the electric power source 10 which has not yet deteriorated, the quantity of operation of the load 121R, that is operated during a state that the voltage is in the predefined voltage range, decreases. Thus, by correcting the predefined threshold value in step S220 to be smaller, effect due to temperature can be mitigated, and degradation in precision of detection of deterioration or failure in the electric power source 10 can be suppressed.

Further, the control unit 50 may be configured in such a manner that it does not perform estimating or detecting of at least one of deterioration or failure in the electric power source 10, when the temperature of the electric power source 10 is lower than a second temperature threshold value. That is, the control unit 50 does not execute the first diagnosis function shown in FIG. 9, in the case that the temperature of the electric power source 10 is lower than the second temperature threshold value. In this regard, the second temperature threshold value may be smaller than the first temperature threshold value. The second temperature threshold value may be set within the range of −1 to 1 degree Celsius, for example.

Further, the control unit 50 may heat the electric power source 10 by controlling the heater 70, in the case that the temperature of the electric power source 10 is lower than a third temperature threshold value. In the case that the temperature of the electric power source 10 is low, degradation in precision of detection of deterioration or failure in the electric power source 10 can be suppressed, by increasing the temperature of the electric power source 10. The third temperature threshold value may be set within the range of −1 to 1 degree Celsius, for example.

(Predefined Voltage Range in First Diagnosis Function)

The predefined voltage range used in the first diagnosis function will be further explained with reference to FIG. 10. The predefined voltage range may be a predetermined interval (a voltage range) from a discharge cutoff voltage to a full-charge voltage. Thus, the first diagnosis function is not executed when the voltage value of the electric power source 10 is less than the discharge cutoff voltage.

It is preferable that the predefined voltage range be set to a range excluding a plateau range wherein change in the voltage value of the electric power source 10 corresponding to change in the quantity of stored electric power or the state of charge is small, compared with those in other voltage ranges. The plateau range is defined by a voltage range wherein the quantity of change in the voltage of the electric power source 10 corresponding to change in the state of charge (SOC) is equal to or less than 0.01-0.005 (V/%), for example.

Regarding the plateau range, since it has a large electric power storage capacity within a relatively small voltage range, the value relating to operation of the load 121R may change greatly in a relatively small voltage range. Thus, there is a risk that erroneous detection may occur in the above-explained first diagnosis function. Accordingly, it is preferable that the predefined voltage range be set to a range excluding the plateau range.

The plateau range, with respect to which the predefined voltage range is not set, may be defined by a range which includes both a plateau range wherein change in the voltage value of the electric power source 10 corresponding to change in the quantity of stored electric power or the state of charge of the electric power source 10, which is brand-new, is small compared with those in other voltage ranges, and a plateau range wherein change in the voltage value of the electric power source 10 corresponding to change in the quantity of stored electric power or the state of charge of the electric power source 10, which has been deteriorated, is small compared with those in other voltage ranges. As a result, with respect to both a brand-new electric power source 10 and a deteriorated electric power source 10, possibility of occurrence of erroneous detection can be lowered.

Further, the first diagnosis function may be executed in plural predefined voltage ranges. It is preferable that the plural predefined voltage ranges do not overlap with each other. The control unit 50 can execute, in each predefined voltage range, the first diagnosis function by using a flow that is the same as that of the flow chart in FIG. 9.

In the example shown in FIG. 10, three predefined voltage ranges (the first section, the second section, and the third section) are set. In an example, the upper limit value of the first section may be 4.1 V, and the lower limit value of the first section may be 3.9 V. The upper limit value of the second section may be 3.9 V, and the lower limit value of the second section may be 3.75 V. The upper limit value of the third section may be 3.75 V, and the lower limit value of the third section may be 3.7 V.

The control unit 50 may perform comparison in step S220 in each of the plural predefined voltage ranges, and, if the value relating to the quantity of operation of the load 121R, with respect to at least one of the plural predefined voltage ranges, is equal to or less than the above-explained predefined threshold value (refer to step S220), it may judge that the electric power source 10 has been deteriorated or has failure.

Regarding the plural predefined voltage ranges, the predefined voltage range is set in such a manner that it is set to be narrower as change in the voltage value of the electric power source 10 corresponding to change in the quantity of stored electric power or the state of charge is smaller. As a result, the values relating to the quantities of operation of the load 121R operated in the respective predefined voltage ranges are made uniform, so that precision of the first diagnosis functions executed in the respective predefined voltage ranges is made uniform.

Further, the control unit 50 may be configured in such a manner that it can estimate or detect at least one of deterioration and failure in the electric power source 10, in a specific voltage range including at least one of the plural predefined voltage ranges, based on the value relating to the quantity of operation of the load 121R operated during a state that the voltage value of the electric power source 10 is in the specific voltage range. Specifically, the control unit 50 may set a voltage range including at least two, more preferably, three, of the first section, the second section, and the third section as a specific voltage range, for example, and execute the diagnosis function shown in FIG. 9.

In the case that the diagnosis function shown in FIG. 9 is executed in a specific voltage range including two or more adjacent predefined voltage ranges in the plural predefined voltage ranges, it is preferable that the predefined threshold value used in step S220 be smaller than a sum total of the predefined threshold values used in step S220 in the flow chart shown in FIG. 9 that is executed with respect to the respective predefined voltage ranges. For example, the predefined threshold value used in step S220, in the case that the flow chart shown in FIG. 9 is executed with respect to the whole section including the first section, the second section, and the third section, may be smaller than a sum total of the predefined threshold values used in step S220, in the case that the flow chart shown in FIG. 9 is executed with respect to each of the first section, the second section, and the third section. As a result, there may be a case that at least one of deterioration and failure in the electric power source 10 is estimated or detected with respect to the whole section, even in the case that at least one of deterioration and failure in the electric power source 10 cannot be estimated or detected with respect to each of the first section, the second section, and the third section due to the state of the electric power source 10 or the way of use of the inhalation component generation device 100. Thus, precision of estimation or detection of at least one of deterioration and failure in the electric power source 10 can be improved.

(Irregular Process of First Diagnosis Function)

In the case that the electric power source 10 is charged, by charging the electric power source 10, to present a value that is larger than the lower limit of the predefined voltage range and smaller than the upper limit of the predefined voltage range, or, generally, in the case that it is not charged to present a full-charge voltage, the value relating to the quantity of operation of the load 121R operated in the whole predefined voltage range cannot be obtained, so that the above-explained first diagnosis function shown in FIG. 9 may not function normally.

Further, in the case that a long period of time has elapsed since an inhalation component source has been vaporized or atomized by the load, self-discharge due to dark current or the like may occur in the electric power source 10 and the voltage of the electric power source 10 may naturally decreases. In such a case, with respect to the above-explained predefined voltage range, the voltage range contributed to vaporizing or atomizing of the inhalation component source may not be 100%, and may be equal to or less than a predefined fraction or width. For example, it is supposed that the voltage of the electric power source 10 has been reduced from 3.9 V to 3.8 V as a result that vaporizing or atomizing of the inhalation component source has been performed, and the voltage of the electric power source 10 has become 3.65 V as a result that it is left thereafter for a long period of time. In the above case, with respect to the predefined voltage range (the second section in FIG. 10), the voltage range contributed to vaporizing or atomizing of the inhalation component source is approximately 40%. In the case that the voltage of the electric power source 10 is greatly reduced in this manner irrespective of vaporizing or atomizing of the inhalation component source, the above-explained first diagnosis function shown in FIG. 9 may not function normally.

Such long-term leaving can be detected by measuring the time past since the inhalation component source is vaporized or atomized by the load 121R, and judging based on the elapsed time. That is, the control unit 50 may start a timer for counting the time elapsed, at timing of step S108 in FIG. 7. Alternatively, long-term leaving can be detected based on change in the voltage of the electric power source 10 since the inhalation component source is vaporized or atomized by the load 121R. In the above case, the control unit 50 may obtain, at timing of step S200 in FIG. 9, a difference between the voltage of the electric power source 10 at present and the voltage of the electric power source 10 obtained before the present time. When the difference between the voltages exceeds a predetermined value, the control unit 50 can judge that long-term leaving has occurred.

Thus, as explained above, in the case that a state that the first diagnosis function does not work normally has occurred, it is preferable to correct the algorithm of the first diagnosis function or avoid execution of the first diagnosis function.

For example, in the case that the range, in the predefined voltage range, that is contributed to vaporizing or atomizing of the inhalation component source is equal to or less than a predefined fraction or width, it is preferable that judgment with respect to deterioration or failure in the electric power source 10 in the predefined voltage range not be performed. As a result, it becomes possible to prevent the control unit 50 from performing erroneous detection in the first diagnosis function, in the case that the value relating to the quantity of operation of the load 121R operated in the whole predefined voltage range cannot be obtained due to half-way charging, self-discharging, or the like.

Alternatively, in the case that the range, in the predefined voltage range, contributed to vaporizing or atomizing of the inhalation component source is equal to or less than the predefined fraction or width, the control unit 50 may correct the predefined threshold value in step S220 shown in FIG. 9 to make it smaller. For example, by correcting the predefined threshold value to have a smaller value according to the range, in the predefined voltage range, contributed to vaporizing or atomizing of the inhalation component source, the first diagnosis function can be executed while suppressing erroneous detection in the first diagnosis function.

Further, as explained above, in the case that the first diagnosis function is performed with respect to the plural predefined voltage ranges, the control unit 50 may not perform diagnosis of deterioration or failure in the electric power source with respect to an irregular range, in the plural predefined voltage ranges, wherein the range contributed to vaporizing or atomizing of the inhalation component source is equal to or less than the predefined fraction or width. That is, in a section (an irregular range), in each of the predefined voltage ranges (for example, the first section, the second section, or the third section), wherein the value relating to the quantity of operation of the load 121R cannot be obtained sufficiently due to half-way charging, self-discharging, or the like, the control unit 50 may not perform diagnosis of deterioration or failure in the electric power source.

Even in such a case, the control unit 50 may estimate or detect, in a specific voltage range including one or more predefined voltage ranges in the plural predefined voltage ranges, at least one of deterioration and failure in the electric power source 10 based on the value relating to the quantity of operation of the load 121R operated when the voltage value of the electric power source 10 is in the specific voltage range. In the above case, it is preferable that the voltage range including one or more predefined voltage ranges in the plural predefined voltage ranges be set to that excluding the irregular range.

For example, in the example shown in FIG. 10, in the case that the electric power source 10 is charged until the voltage of the electric power source 10 is increased to 4.05 V, the first diagnosis function may not be executed in the first section. In the above case, one of deterioration and failure in the electric power source 10 may be estimated or detected, based on the value relating to the quantity of operation of the load 121R operated in the voltage range comprised of the second section and the third section (3.7V-3.9 V).

In the above case, the predefined threshold value used in step S220 in the case that the first diagnosis function is performed based on the value relating to the quantity of operation of the load 121R operated in the voltage range comprised of the second section and the third section may be configured by subtracting, from the predefined threshold value (the specific value) used in step S220 in the case that the first diagnosis function is performed based on the value relating to the quantity of operation of the load 121R operated in the voltage range comprised of all ranges including the first section, the second section, and the third section, a value equal to or less than the predefined threshold value used in step S220 in the case that the first diagnosis function is performed based on the value relating to the quantity of operation of the load 121R operated in the voltage range of the third section.

Further, as explained above, in the case that irregular ranges exist in the plural predefined voltage ranges, and that the first diagnosis function is executed in a wider range including the irregular ranges, for example, in the whole section (the first section, the second section, and the third section), the predefined threshold value used in step S220 may be corrected to have a smaller value.

Based on the voltage of the electric power source 10 contributed to vaporizing or atomizing of the inhalation component source after long-term leaving in the predefined voltage range, the control unit 50 may correct at least one of the lower limit value of the predefined voltage range and the predefined threshold value. For example, the control unit 50 may correct the lower limit value of the predefined voltage range to have a smaller value (to make it approach 0 V), may not correct the predefined threshold value, and may perform the first diagnosis function in the predefined voltage range. In the other example, the control unit 50 may not correct the lower limit value of the predefined voltage range, may correct the predefined threshold value to have a smaller value, and may perform the first diagnosis function in the predefined voltage range. Further, in another example, the control unit 50 may correct both the lower limit value of the predefined voltage range and the predefined threshold value, and perform the first diagnosis function in the predefined voltage range.

Based on the voltage of the electric power source 10 contributed to vaporizing or atomizing of the inhalation component source after long-term leaving in the predefined voltage range, and the value relating to the quantity of operation of the load 121R which has been operated during the period that the voltage of the electric power source 10 is decreased from the above voltage to the lower limit value of the predefined voltage range, the control unit 50 may set a new predefined voltage range and a corresponding predefined threshold value in step S220 shown in FIG. 9. The newly set predefined voltage range will be used in the first diagnosis function performed after next charging.

Based on the voltage of the electric power source 10 contributed to vaporizing or atomizing of the inhalation component source after long-term leaving in the predefined voltage range, the control unit 50 may correct at least one of the lower limit value of the predefined voltage range and the predefined threshold value. For example, the control unit 50 may correct the lower limit value of the predefined voltage range to have a smaller value (to make it approach 0 V), may not correct the predefined threshold value, and may perform the first diagnosis function in the predefined voltage range. In the other example, the control unit 50 may not correct the lower limit value of the predefined voltage range, may correct the predefined threshold value to have a smaller value, and may perform the first diagnosis function in the predefined voltage range. Further, in another example, the control unit 50 may correct both the lower limit value of the predefined voltage range and the predefined threshold value, and perform the first diagnosis function in the predefined voltage range.

Further, even when the inhalation component generation device 100 is not being used, for example, even when the load 121R is not being operated, the control unit 50 may continue monitoring of the voltage of the electric power source 10. In the above case, the control unit 50 may execute the first diagnosis function while performing correction of the predefined threshold value in step S220 shown in FIG. 9 explained above and so on, even in the case that the voltage of the electric power source 50 has decreased to that below the upper limit value in the predefined voltage range without contribution to vaporizing or atomizing of the inhalation component source, due to self discharging or the like.

Alternatively, the control unit 50 may obtain an accumulated value obtained by accumulating time during that the voltage of the electric power source 10 has decreased without contribution to vaporizing or atomizing of the inhalation component source. If the accumulated value is converted, based on predefined relationship, to a value relating to the quantity of operation of the load 121R, the first diagnosis function can be executed without performing correction of the predefined threshold value in step S220 shown in FIG. 9 such as that explained above. That is, the control unit 50 may accumulate, as the accumulated value, the time during that the voltage of the electric power source has decreased without contribution to vaporizing or atomizing of the inhalation component source in the predefined range, and add a value obtained by correcting the accumulated value based on the predefined relationship to the value relating to the quantity of operation of the load. For example, based on a ratio between a current value or consumed electric power per unit time in the case that the voltage of the electric power source 10 decreases without contribution to vaporizing or atomizing of the inhalation component source and a current value or consumed electric power per unit time in the case that the voltage of the electric power source 10 decreases with contribution to vaporizing or atomizing of the inhalation component source, the accumulated value may be corrected to make it smaller, so that the value relating to the quantity of operation of the load 121R may be converted. In this regard, the current value or the consumed electric power per unit time in the case that the voltage of the electric power source 10 decreases without contribution to vaporizing or atomizing of the inhalation component source, and the current value or the consumed electric power per unit time in the case that the voltage of the electric power source 10 decreases with contribution to vaporizing or atomizing of the inhalation component source may be actually measured by the voltage sensor 150 or the current sensor 160. Further, in place of the above construction, it is possible to store the above values in advance in a memory in the control unit 50 or the like, and read the values by the control section 51 as necessary. In this regard, in place of the above values, it is possible to directly store, in a memory, the ratio between the current value or the consumed electric power per unit time in the case that the voltage of the electric power source 10 decreases without contribution to vaporizing or atomizing of the inhalation component source and the current value or the consumed electric power per unit time in the case that the voltage of the electric power source 10 decreases with contribution to vaporizing or atomizing of the inhalation component source.

(Control of Charge by Processor in Charger)

Figure 11:
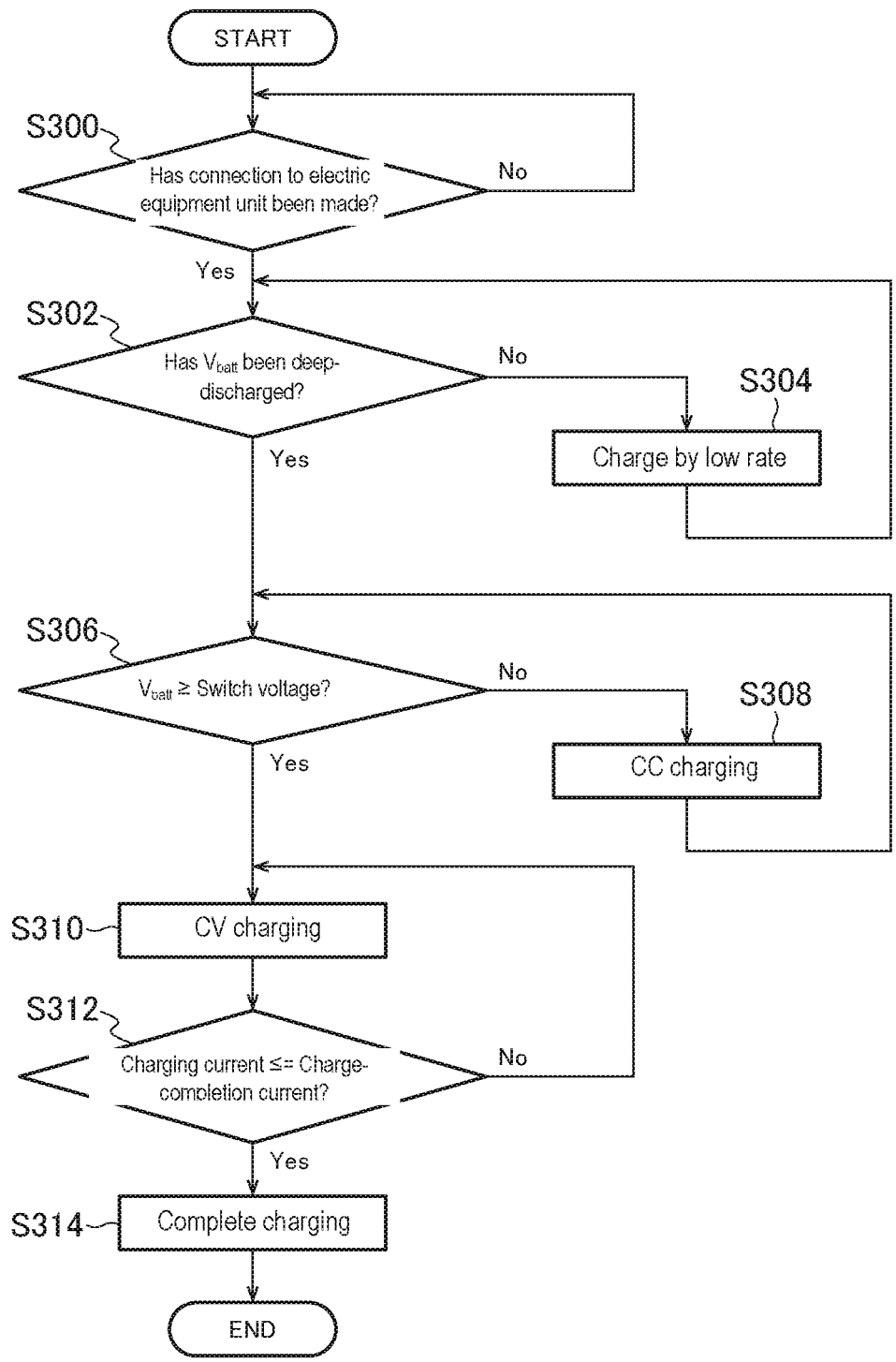
FIG. 11 is a flow chart showing an example of a control method performed by a processor in a charger.

FIG. 11 is a flow chart showing an example of a control method performed by a processor in the charger 200. A processor 250 judges whether connection to the electric equipment unit 110 has been made (step S300). The processor 250 waits until the charger 200 is connected to the electric equipment unit 110.

Connection between the processor 250 and the electric equipment unit 110 can be detected by use of a publicly known method. For example, the processor 250 can judge whether connection to the electric equipment unit 110 has been made, by detecting change in a voltage across a pair of electric terminals of the charger 200 by the voltmeter 240.

After the charger 200 is connected to the electric equipment unit 110, the processor 250 judges whether the electric power source 100 has been deep-discharged (step S302). In this regard, deep-discharge of the electric power source 10 means that the voltage of the electric power source 10 is in a state that it is less than a deep-discharge judgment voltage that is lower than the discharge cutoff voltage. The deep-discharge judgment voltage may be within the range of 3.1 V to 3.2 V, for example.

The processor 250 in the charger 200 can estimate the voltage of the electric power source 10 by using the voltmeter 240. The processor 250 may judge, by comparing the estimate value of the voltage of the electric power source 10 with the deep-discharge judgment voltage, whether the electric power source 10 has deep-discharged.

If it is judged by the processor 250 that the electric power source 10 has deep-discharged, the electric power source 10 is charged by applying low-rate electric power (step S304). As a result, the electric power source 10 may recover from the deep-discharge state to a state wherein it has a voltage higher than the discharge cutoff voltage.

In the case that the voltage of the electric power source 10 is equal to or higher than the discharge cutoff voltage, the processor 250 judges whether the voltage of the electric power source 10 is equal to or higher than a switch voltage (step S306). The switch voltage is a threshold value for separating a section for constant current charging (CC charging) and a section for constant voltage charging (CV charging). The switch voltage may be within the range of 4.0 V-4.1 V, for example.

In the case that the voltage of the electric power source 10 is less than the switch voltage, the processor 250 charges the electric power source 10 by using a constant current charging system (step S308). In the case that the voltage of the electric power source 10 is equal to or larger than the switch voltage, the processor 250 charges the electric power source 10 by using a constant voltage charging system (step S310). In the constant voltage charging system, since the voltage of the electric power source 10 increases as charging progresses, charging current decreases.

After starting charging of the electric power source 10 by using the constant voltage charging system, the processor 250 judges whether the charging current is equal to or less than a predetermined charge-completion current (step S312). In this regard, the charging current may be obtained by using the ammeter 230 in the charger 200. In the case that the charging current is larger than the predetermined charge-completion current, charging of the electric power source 10 is continued by using the constant voltage charging system.

In the case that the charging current is equal to or less than the predetermined charge-completion current, the processor 250 judges that the electric power source 10 has reached a full charge state, and stops charging (step S314).

(Control by Control Unit in Charging Mode)

Figure 12:
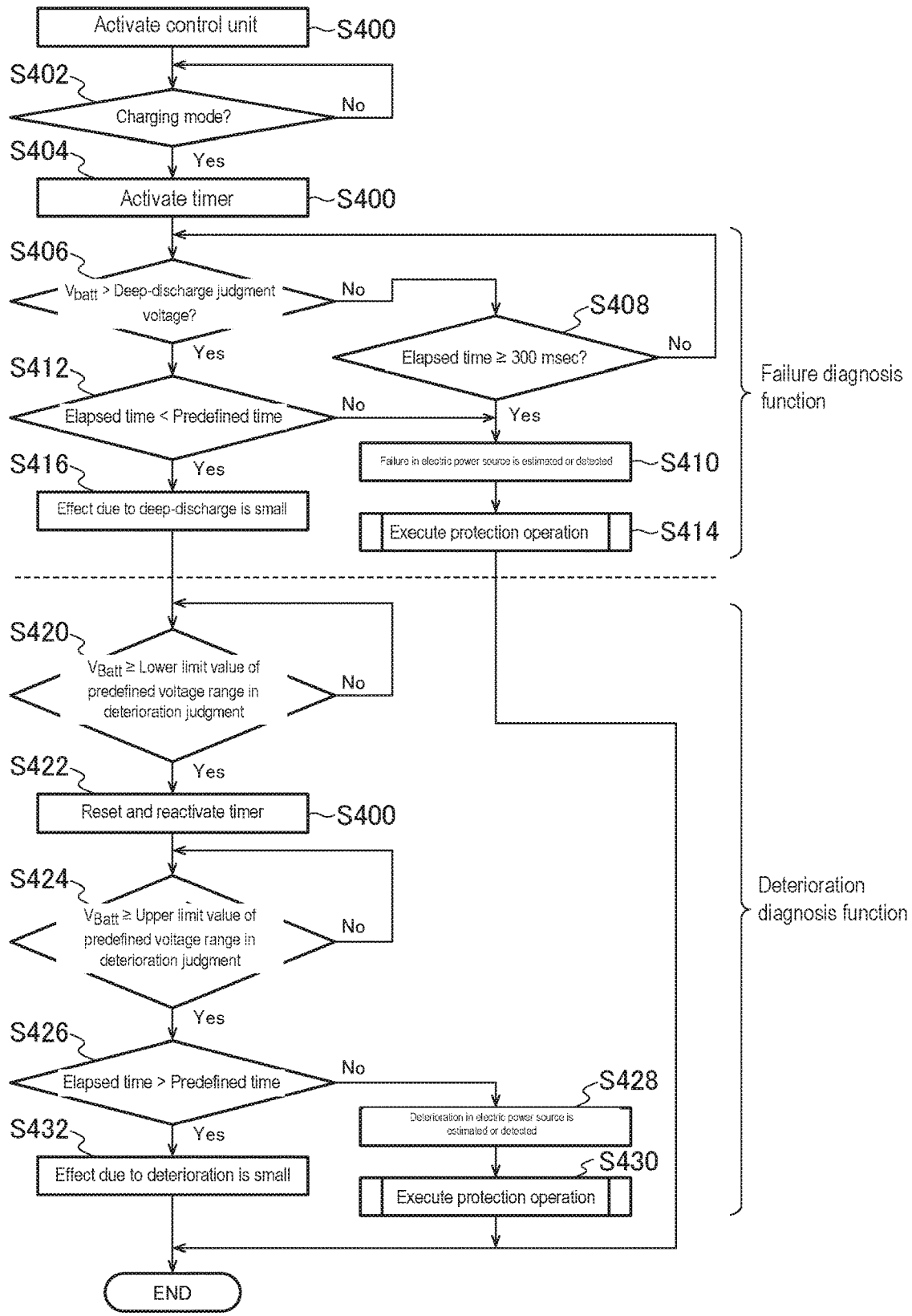
FIG. 12 is a flow chart showing an example of a control method performed by a control unit in a charging mode.
Figure 13:
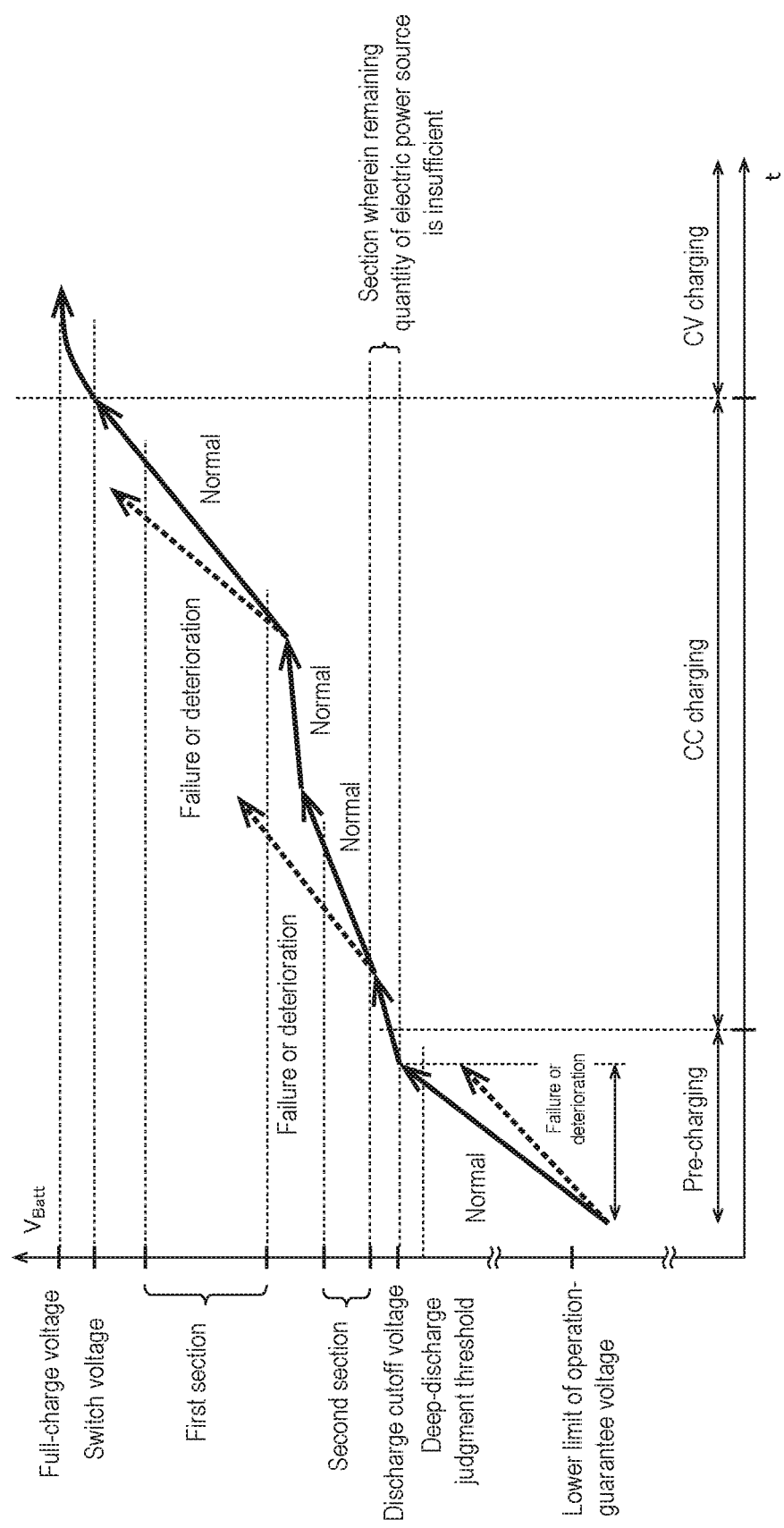
FIG. 13 is a figure for explaining increase in the voltages of a normal electric power source and a deteriorated or failed electric power source.

FIG. 12 is a flow chart showing an example of a control method performed by a control unit in a charging mode. FIG. 13 is a figure for explaining increase in the voltages of a normal electric power source and a deteriorated or failed electric power source. The charging mode is a mode that allows charging of the electric power source 10.

The control unit 50 may execute a second diagnosis function for estimating or detecting at least one of deterioration and failure in the electric power source 10, during charging of the electric power source 10 by the charger 200. In the present embodiment, the second diagnosis function may comprise a failure diagnosis function for diagnosing failure in the electric power source 10 and a deterioration diagnosis function for diagnosing deterioration in the electric power source 10. As will be explained in the following description, the control unit 50 may be configured to be able to estimate or detect at least one of deterioration and failure in the electric power source 10, based on time required to raise the voltage value of the electric power source 10 from a lower limit to an upper limit in a predefined voltage range during charging of the electric power source 10. Since the voltage value of the electric power source 10 can be obtained by using the voltage sensor 150, the control unit 50 can execute the failure diagnosis function and the deterioration diagnosis function, that will be explained later, without communication with the processor 250 in the charger 200.

Specifically, first, in the case that the control unit 50 has not been activated during charging, the control unit 50 is activated automatically (step S400). More specifically, when the voltage of the electric power source 10 goes beyond the lower limit value of an operation-guarantee voltage of the control unit 50, the control unit 50 is activated automatically. In this regard, the lower limit value of the operation-guarantee voltage may be that in the range of deep-discharge voltages. The lower limit value of the operation-guarantee voltage may be within the range of 2.0 V-2.5 V, for example.

The control unit 50 judges whether the mode is the charging mode (step S402). The mode is judged to be the charging mode by detecting connection of the charger 200 to the electric equipment unit 110. Connection of the charger 200 to the electric equipment unit 110 can be detected by obtaining change in the voltage across the pair of the electric terminals 110t.

When connection of the charger 200 to the electric equipment unit 110 is detected by the control unit 50, the timer is activated, and time from start of charging or activation of the control unit is measured (step S404).

Next, the control unit 50 executes the failure diagnosis function with respect to the electric power source 10. Specifically, the control unit 50 obtains a voltage ($V_{batt}$) of the electric power source 10, and judges whether the voltage ($V_{batt}$) of the electric power source 10 is larger than the deep-discharge judgment voltage (step S406). The voltage ($V_{batt}$) of the electric power source 10 can be obtained by using the voltage sensor 150. The deep-discharge judgment voltage is that as explained above, and may be within the range of 3.1 V-3.2 V (the discharge cutoff voltage), for example. It should be reminded that, during charging of the electric power source 10, the control unit 50 periodically obtains the voltage of the electric power source 10.

In the case that the electrode structure and/or the electrolyte in the electric power source 10 have/has been changed irreversibly due to deep-discharge, electrochemical reaction at the time of normal charging does not occur in the inside of the electric power source 10 even if it is charged. Thus, in the case that the time period, during that the voltage ($V_{batt}$) of the electric power source 10 is equal to or less than the deep-discharge judgment voltage, exceeds predefined time elapsed since activation of the timer, for example, if the time period exceeds 300 msec, the control unit 50 estimates or detects that the electric power source 10 has been failed due to deep-discharge (steps S408 and S410). Also, in the case that the time required, for the voltage value of the electric power source 10, to reach the deep-discharge judgment voltage since the time of activation of the timer exceeds a predefined time, for example, 300 msec, the control unit 50 judges that the electric power source 10 has been failed due to deep-discharge (steps S412 and S410).

When it is estimated or detected that the electric power source 10 has been failed due to deep-discharge, the control unit 50 may perform predetermined protection operation (step S414). For example, the protection operation may be operation, performed by the control unit 50, for forcibly stopping or restricting charging of the electric power source 10. The forced stop or restriction of charging may be realized by disconnecting, in the electric equipment unit 110, electric connection between the electric power source 10 and the charger 200. For example, the control unit 50 may turn off at least one of the switch 140 and the stopping unit 180. At the time that the control unit 510 has estimated or detected that the electric power source 10 has been failed due to deep-discharge, it may inform a user of abnormality via the notification unit 40.

As explained above, the control unit 50 may execute the failure diagnosis function, based on time required to raise the voltage value of the electric power source 10 from a lower limit to an upper limit in a predefined voltage range during charging of the electric power source 10.

The lower limit of the predefined voltage range may be the lower limit value of the operation-guarantee voltages of the control unit 50, for example. In the above case, as explained above, the control unit 50 may execute the failure diagnosis function, based on time required to reach the deep-discharge judgment voltage (a predetermined threshold value) since the time of activation of the timer, after activation of the control unit, exceeds a predefined time. Alternatively, the lower limit of the predefined voltage range may be set to a value lower than the discharge cutoff voltage of the electric power source 10 and larger than the lower limit value of the operation-guarantee voltages of the control unit 50. In the above case, the timer may be activated when the voltage of the electric power source 10 reaches the lower limit of the predefined voltage range.

It is preferable that the above-explained failure diagnosis function be configured in such a manner that it cannot be executed when the inhalation component generation device 100 is in a mode other than the charging mode. Then, it becomes possible to avoid a risk that the failure diagnosis function is executed erroneously, when the voltage of the electric power source 10 temporarily decreases to the deep-discharge state as a result that it is brought to an extremely low temperature state or the like during the charging mode.

Further, the above-explained failure diagnosis function may be configured to estimate or detect failure in the electric power source when the voltage value of the electric power source 10, during charging of the electric power source 10, is lower than the discharge cutoff voltage of the electric power source 10.

In the case that the time required, for the voltage value of the electric power source 10, to reach the deep-discharge judgment voltage since the time of activation of the timer is equal to or less than a predefined time, for example, 300 msec, it may be judged that effect of deep-discharge is small, and charging of the electric power source 10 may be continued (step S416). In the above case, the control unit 50 may further perform the deterioration diagnosis function that will be explained later. It is preferable that the control unit 50 be configured in such a manner that it does not execute the failure diagnosis function and the deterioration diagnosis function at the same time, for preventing occurrence of hunting between the failure diagnosis function and the deterioration diagnosis.

In the deterioration diagnosis, the control unit 50 first obtains a voltage value of the electric power source 10 during charging, and judges whether the voltage of the electric power source is equal to or larger than a lower limit value of a predefined voltage range (step S420). In this regard, it is preferable that the upper limit value of the predefined voltage range used in the above-explained failure diagnosis function be set to that smaller than the lower limit value of the predefined voltage range used in the deterioration diagnosis function. On the other hand, it is preferable that the predefined voltage range used in the deterioration diagnosis function do not include the discharge cutoff voltage. By setting the predefined voltage ranges used in the failure diagnosis function and the deterioration diagnosis function, respectively, the above-explained hunting between the failure diagnosis function and the deterioration diagnosis can be prevented more effectively.

It is more preferable that the control unit 50 be configured in such a manner that it can execute the deterioration diagnosis function for estimating or detecting deterioration in the electric power source 10, when the voltage value of the electric power source 10, during charging of the electric power source 10, is higher than the discharge cutoff voltage of the electric power source 10. Then, occurrence of hunting between the failure diagnosis function and the deterioration diagnosis can be prevented. In this regard, it is preferable that the control unit 50 be configured in such a manner that it does not execute both the failure diagnosis function and the deterioration diagnosis function, for preventing occurrence of hunting between the failure diagnosis function and the deterioration diagnosis, in the case that the voltage of the electric power source 10 is the discharge cutoff voltage.

In the case that the voltage of the electric power source 10 is equal to or greater than the lower limit value of the predefined voltage range, the control unit 50 resets the timer and re-activates the timer (step S422). The control unit 50 measures, by use of the timer, time elapsed until the time that the voltage of the electric power source 10 becomes that equal to or greater than the upper limit value of the predefined voltage range (step S424).

In the case that the electric power source 10 has been deteriorated, there is tendency that the full-charge capacity of the electric power source 10 decreases, although voltage values of the electric power source 10 that may be presented thereby, such as a full-charge voltage, a discharge cutoff voltage, and so on do not change. Thus, the control unit 50 judges whether the elapsed time that has been required to raise the voltage of the electric power source 10 from the lower limit value to the upper limit value of the predefined voltage range is longer than predefined time (step S426). If the voltage of the electric power source 10 is raised, during charging of the electric power source 10, from the lower limit to the upper limit of the predefined voltage range within the predefined time, the control unit 50 estimates or detects that the electric power source 10 has been deteriorated (step S428).

When it is estimated or detected that the electric power source 10 has been deteriorated, the control unit 50 may perform predetermined protection operation (step S430). For example, the protection operation may be operation, performed by the control unit 50, for forcibly stopping or restricting charging of the electric power source 10. The forced stop or restriction of charging may be realized by disconnecting, in the electric equipment unit 110, electric connection between the electric power source 10 and the charger 200. For example, the control unit 50 may turn off at least one of the switch 140 and the stopping unit 180. Further, at the time that the control unit 50 has estimated or detected that the electric power source 10 has been deteriorated, it may inform a user of abnormality via the notification unit 40.

If the voltage of the electric power source 10 is not raised, during charging of the electric power source 10, from the lower limit to the upper limit of the predefined voltage range within the predefined time, the control unit 50 judges that deterioration of the electric power source 10 is minor, and charging of the electric power source 10 is continued without any change (step S432).

The failure diagnosis function and the deterioration diagnosis function may be configured in such a manner that they are executed by using the same variable, specifically, in the above-explained example, the elapsed time required for change from the lower limit to the upper limit in the predefined voltage range. In the above case, regarding the relationship with respect to the magnitude of the above variable and the threshold value for estimating or detecting the state that the electric power source has been failed or deteriorated, it is preferable that the above relationship in the failure diagnosis function be reversed in the deterioration diagnosis function. More specifically, when the variable used in the failure diagnosis function, specifically, the above-explained elapsed time in the above example, is larger than a first threshold value, for example, 300 msec, the control unit 50 judges that the electric power source 10 has failed. On the other hand, when the variable used in the deterioration diagnosis function, specifically, the above-explained elapsed time in the above example, is smaller than a second threshold value (predefined time), the control unit 50 judges that the electric power source 10 has been deteriorated. As shown in FIG. 13, in the voltage range below the discharge cutoff voltage, the voltage of a normal electric power source 10 increases faster than that of a deteriorated or failed electric power source 10, during charging. On the other hand, in the voltage range above the discharge cutoff voltage, the voltage of a deteriorated or failed electric power source 10 increases faster than that of a normal electric power source 10, during charging. By reversing the relationship with respect to the magnitude of the variable and the threshold value in the failure diagnosis function and the deterioration diagnosis function, deterioration or failure in the electric power source 10 can be estimated or detected in both the failure diagnosis function and the deterioration diagnosis function.

The control unit 50 may be configured to be able to change or correct, when temperature of the electric power source 10 is lower than a fourth temperature threshold, the algorithm for estimating or detecting at least one of deterioration and failure in the electric power source 10, that is, the algorithm for executing the second diagnosis function shown in FIG. 12. Specifically, it is preferable that the control unit 50 correct the predefined time in step S412 and/or step S426, and perform comparison in step S412 and/or step S426 based on the corrected time threshold value. The fourth temperature threshold value may be set within the range of 1 to 5 degrees Celsius, for example.

It has been known that internal resistance of the electric power source 10 increases when temperature of the electric power source 10 is low. Thus, even in an electric power source 10 which has not been deteriorated, time required to increase the voltage of the electric power source 10 from the lower limit to the upper limit of the predefined voltage range varies. Accordingly, in the case that the temperature of the electric power source 10 is low, effect due to temperature can be mitigated, and degradation in precision of detection of deterioration or failure in the electric power source 10 can be suppressed, by correcting the predefined time in step S412 and/or step S426.

Further, the control unit 50 may be configured in such a manner that it does not perform estimating or detecting of at least one of deterioration and failure in the electric power source 10, when the temperature of the electric power source 10 is lower than a fifth temperature threshold value. That is, in the case that the temperature of the electric power source 10 is lower than the fifth temperature threshold value, the control unit 50 may not execute the failure diagnosis function and/or the deterioration diagnosis function shown in FIG. 12. In this regard the fifth temperature threshold value may be smaller than the fourth temperature threshold value. The fifth temperature threshold value may be set within the range of −1 to 1 degrees Celsius, for example.

Further, the control unit 50 may heat the electric power source 10 by controlling the heater 70, when the temperature of the electric power source 10 is lower than a sixth temperature threshold value. In the case that the temperature of the electric power source 10 is low, degradation in precision of detection of deterioration or failure in the electric power source 10 can be suppressed by raising the temperature of the electric power source 10. The sixth temperature threshold value may be set within the range of −1 to 1 degrees Celsius, for example.

(Predefined Voltage Range in Deterioration Diagnosis Function)

The predefined voltage range used in the deterioration diagnosis function will be further explained with reference to FIG. 13. The predefined voltage range may be a predetermined section (voltage range) between the discharge cutoff voltage and the full-charge voltage.

It is preferable that the predefined voltage range be set to a range excluding a plateau range wherein change in the voltage value of the electric power source 10 corresponding to change in the quantity of stored electric power or the state of charge is small, compared with those in other voltage ranges. The plateau range is defined by a voltage range wherein the quantity of change in the voltage of the electric power source 10 corresponding to change in the state of charge (SOC) is equal to or less than 0.01-0.005 (V/%), for example.

Regarding the plateau range, since change in the voltage of the electric power source corresponding to time elapsed during charging is small, a significant difference could rarely be observed between a normal electric power source and a deteriorated electric power source. Thus, there is a risk that erroneous detection may occur in the above-explained deterioration diagnosis function. Accordingly, it is preferable that the predefined voltage range be set to a range excluding the plateau range.

Further, it is preferable that the predefined voltage range used in the deterioration diagnosis function be set to a range excluding a range in which constant voltage charging with respect to the electric power source 10 is performed. Since the range in which constant voltage charging is performed corresponds to an ending stage of the charging sequence, the range corresponds to a range wherein change in the voltage of the electric power source corresponding to time elapsed during charging is small. Thus, as a result that the predefined voltage range used in the deterioration diagnosis function is set to a range excluding a range in which constant voltage charging is performed, precision of the deterioration diagnosis function can be improved.

In this construction, the processor 250 in the charger 200 estimates the voltage of the electric power source 10 by using the voltmeter 240 in the charger 200. On the other hand, the control unit 50 obtains the voltage of the electric power source 10 by using the voltage sensor 150 in the electric equipment unit 110. In this regard, the voltage of the electric power source 10 recognized by the charger 200 is a value obtained by adding, to a true value of the voltage of the electric power source 10, voltage drop due the contact resistance of the connecting terminals 110*t*, the resistance of connecting wires for electrically connecting the charger 200 to the electric power source 10, and so on. On the other hand, the voltage of the electric power source 10 recognized by the control unit 50 is not affected, at least, by the voltage drop due the contact resistance of the connecting terminals 110*t*. Thus, there may be a difference between the voltage of the electric power source 10 recognized by the charger 200 and the voltage of the electric power source 10 recognized by the control unit 50. By taking the above difference into consideration, it is preferable that the voltage range of the electric power source 10 for executing the deterioration diagnosis function be set to a range that is lower than a voltage value obtained by subtracting a predefined value from the above-explained switch voltage.

Further, it is preferable that the predefined voltage range used in the deterioration diagnosis function be set to a range excluding a range with respect to that the notification unit 40 informs that the remaining quantity of the electric power source 10 is insufficient. In the case that the predefined voltage range is set to that near the discharge cutoff voltage, the electric power source 10 cannot be charged through out the whole predefined voltage range if charging is performed before the voltage of the electric power source 10 decreases to the discharge cutoff voltage, so that the above-explained deterioration diagnosis function may not work normally. By setting the predefined voltage range used in the deterioration diagnosis function to a range excluding a range wherein the remaining quantity of the electric power source 10 is insufficient, the deterioration diagnosis function is allowed to work normally, even if charging is performed before the voltage of the electric power source 10 decreases to the discharge cutoff voltage.

Further, the deterioration diagnosis function may be executed in plural predefined voltage ranges. It is preferable that the plural predefined voltage ranges do not overlap with each other. The control unit 50 executes, in each of the predefined voltage ranges, a deterioration diagnosis function by using a flow which is the same as that for the part of the deterioration diagnosis function in the flow chart shown in FIG. 12. In the example shown in FIG. 13, two predefined voltage ranges (a first section and a second section) have been set.

(Relationship Between First Diagnosis Function and Second Diagnosis Function)

As explained above, the control unit 50 is configured to be able to execute the first diagnosis function for estimating or detecting at least one of deterioration and failure in the electric power source 10 while the load 121R is being operated, and the second diagnosis function for estimating or detecting at least one of deterioration and failure in the electric power source 10 while the electric power source 10 is being charged.

In this regard, it is preferable that the algorithm included in the first diagnosis function and that included in the second diagnosis function be different from each other. Then, an appropriate algorithm can be applied according to charging and discharging of the electric power source 10, for estimating or detecting at least one of deterioration and failure in the electric power source 10.

The first diagnosis function, i.e., the function executed while the load 121R is being operated, may comprise at least one algorithm for estimating or detecting at least one of deterioration and failure in the electric power source 10. In the above embodiment, the first diagnosis function comprises a single algorithm for estimating or detecting at least one of deterioration and failure in the electric power source 10 only.

For example, regarding a compact and portable inhalation component generation device 100 such as a an electronic cigarette or a heated tobacco product, it is desirable that a control unit 50 having a simple control function be installed therein. In the case that supply of electric power to the load 121R in an electric power supplying mode is controlled by using such a control unit 50 having a simple control function, there will be a limit in arithmetic capacity of the control unit 50 in the electric power supplying mode. In the case that the first diagnosis function includes a single algorithm only, the control unit 50 can estimate or detect at least one of deterioration and failure in the electric power source 10, within a scope wherein other control, for example, control of electric power to the load 121R is not affected by the first diagnosis function.

The second diagnosis function, i.e., the function executed while the electric power source 10 is being charged, may comprise at least one algorithm for estimating or detecting at least one of deterioration and failure in the electric power source 10. In the above embodiment, the second diagnosis function comprises the following two functions, the failure diagnosis function and the deterioration diagnosis function, that have been explained. In addition to the above embodiment, the second diagnosis function may further comprise a different single algorithm or plural algorithms for estimating or detecting at least one of deterioration and failure in the electric power source 10.

Preferably, the number of algorithms included in the second diagnosis function is larger than the number of algorithms included in the first diagnosis function. Thus, the control unit 50 can have room with respect to arithmetic capacity in the charging mode, compared with the case of the electric power supplying mode. By increasing the number of algorithms included in the second diagnosis function in the charging mode by using the room of the arithmetic capacity, at least one of deterioration and failure in the electric power source 10 can be estimated or detected more precisely in the charging mode.

For the purpose of simplification of the construction of the inhalation component generation device 100, the processor 250 in the charger 200 may be configured in such a manner that it cannot communicate with the control unit 50 in the electric equipment unit 110. In addition to simplification of the construction thereof, it becomes unnecessary for the control unit 50 to allocate part of arithmetic capacity to communication with the processor 250 in the charger 200, by constructing the inhalation component generation device 100 as explained above. Thus, more arithmetic capacity can be allocated to the second diagnosis function in the charging mode, so that at least one of deterioration and failure in the electric power source 10 can be estimated or detected more precisely in the charging mode.

More preferably, the number of algorithms included in the second diagnosis function and executable at the same time is larger than the number of algorithms included in the first diagnosis function and executable at the same time. In the example shown in the above embodiment, the failure diagnosis function and the deterioration diagnosis function, that have been explained, may be executable at the same time. Alternatively, in the charging mode, in the case that the voltage of the electric power source 10 has decreased, a diagnosis function such as that for detecting internal short-circuit as failure, may be executed at the same time as execution of the above-explained deterioration diagnosis function.

It is preferable that the number of sensors required when executing the second diagnosis function be less than the number of sensors required when executing the first diagnosis function. In the above embodiment, the second diagnosis function can be executed by using the voltage sensor 150 for obtaining the voltage of the electric power source 10, and the temperature sensor 170 as necessary. On the other hand, the first diagnosis function can be executed by using the voltage sensor 150 for obtaining the voltage of the electric power source 10 and the request sensor (the inhalation sensor 20 or the push button 30), and the temperature sensor 170 as necessary. It should be reminded that the timer for measuring time is not included in the sensors.

It is preferable that the sensors required when executing the second diagnosis function do not include the request sensor (the inhalation sensor 20 or the push button 30). It is difficult to imagine the case wherein the request sensor is operated during charging, when a usual way of use of the inhalation component generation device 100 is considered. In other words, there may be a risk that a wrong event may occur in the second diagnosis function, if the request sensor, which is not originally operated, is included in the sensors required when executing the second diagnosis function. As explained above, it is preferable that the second diagnosis function, that is executed during charging, be executable without using the request sensor for requesting supply of electric power to the load 121R.

It is preferable that the predefined voltage range used in the failure diagnosis function and the deterioration diagnosis function, that have been explained above, in the second diagnosis function, for example, a sum total of the section from the lower limit of the operation-guarantee voltages to the deep-discharge judgment voltage value, the first section, and the second section shown in FIG. 13, be wider than the predefined voltage range used in the first diagnosis function, for example, a sum total of the first section, the second section, and the third section shown in FIG. 10. Since the range of values that the voltage of the electric power source 10 may take in the charge mode is wider than that in the electric power supplying mode, precision of diagnosis of deterioration or failure in the electric power source in the charging mode can be improved, by widening the predefine voltage range used in the second diagnosis function.

(Implementation of Second Diagnosis Function by Charger)

In the above-explained example, the second diagnosis function (the failure diagnosis function and the deterioration diagnosis function) is implemented by the control unit 50 in the electric equipment unit 110. Alternatively, the processor 250 in the charger 200 may implement the second diagnosis function for estimating or detecting at least one of deterioration and failure in the electric power source 10, based on time required for increasing the voltage value of the electric power source 10, during charging of the electric power source 10, from the lower limit to the upper limit in the predefined voltage range. In the above case, the processor 250 in the charger 200 may execute an algorithm of a process similar to that in the flow chart shown in FIG. 12.

In this regard, since the processor 250 in the charger 200 executes the second diagnosis function, step S400 in the flow chart shown in FIG. 12 is not necessary. Further, the voltage of the electric power source 10 obtained by the processor 250 is estimated by the voltmeter 240 installed in the charger 200. In the protection operation (steps S414 and S430), operation may be that the processor 250 in the charger 200 stops the charging current. Other processes are similar to those in the case that the control unit 50 in the electric equipment unit 110 executes the second diagnosis function, so that explanation thereof will be omitted. As explained above, in the case that at least a part of the second diagnosis function, that is originally executed by the control unit 50, is executed in place thereof by the processor in the charger 200 which is electrically connected to the electric power source 10, the control unit 50 can execute a further different algorithm as the second diagnosis function, so that precision of diagnosis of deterioration or failure in the charging mode can be improved.

(Voltage Sensor)

Figure 14:
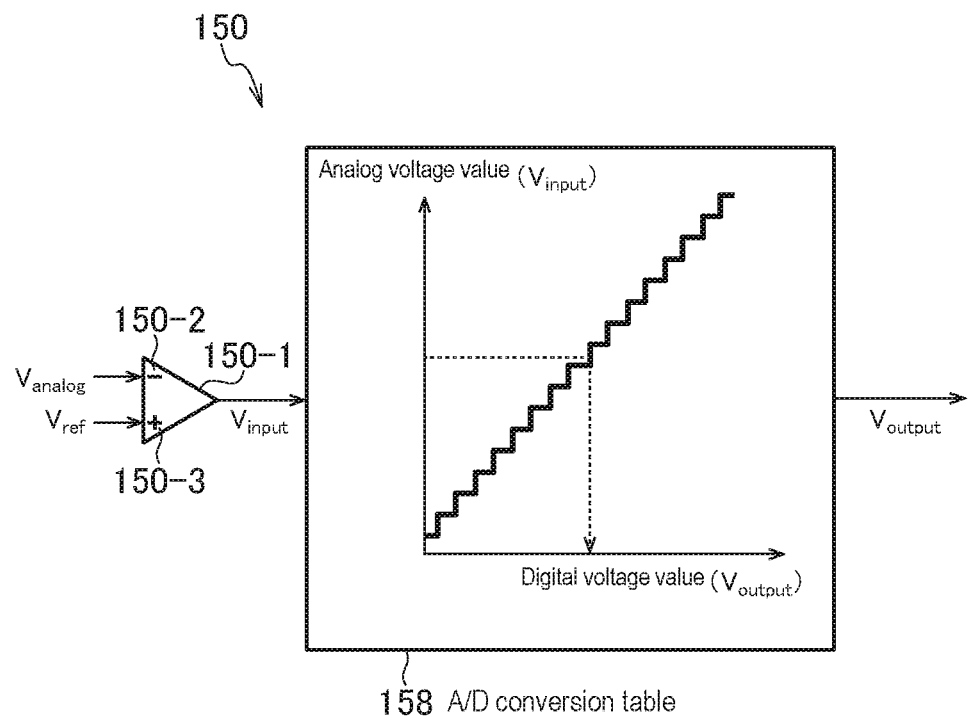
FIG. 14 is a figure showing blocks in a voltage sensor.

First, details of the voltage sensor 150 will be explained by using FIG. 5 and FIG. 14. The voltage sensor 150 is configured to convert an analog voltage value of the electric power source 10 by using a predefined correlation to a digital voltage value, and output the digital voltage value. Specifically, as shown in FIG. 5 and FIG. 14, the voltage sensor 150 may comprise an A/D converter 154 for converting an analog input value to a digital output value. The A/D converter 154 comprises a conversion table 158 for converting an analog input value to a digital output value.

Although resolution relating to conversion to a digital value is not specifically defined, it may be 0.05 V/bit, for example. In the above case, the output value from the voltage sensor 150 is converted for every 0.05 V.

It should be reminded that the conversion table 158 in FIG. 14 shows the correlation in the case that a reference voltage ($V_{ref}$) 156, that will be explained later, is larger than the voltage of the electric power source 10, for example, the full-charge voltage of the electric power source 10. In the above case, in the predefined correlation 158, a larger analog voltage value is associated with a larger digital voltage value.

A voltage (an analog voltage ($V_{analog}$)) of the electric power source 10 is inputted to an inversion input terminal 150-2 of an operational amplifier 150-1, and a reference voltage ($V_{ref}$) 156 (for example, 5.0 V), that is a constant voltage and is higher than the voltage (an analog voltage ($V_{analog}$)) of the electric power source 10, is inputted to the other non-inversion input terminal 150-3. The operational amplifier 150-1 inputs a difference between the above voltages, or a value obtained by amplifying the difference, ($V_{input}$) to the A/D converter 154. The A/D converter 154 converts, based on the predefined correlation (the conversion table) 158, the analog voltage value ($V_{input}$) to a digital voltage value ($V_{output}$) and outputs it. The control unit 50 (the control section 51) would obtain, in the case that it obtains the voltage of the electric power source 10 during the above-explained all processes, the digital voltage value ($V_{output}$) outputted from the voltage sensor 150.

In this regard, it is preferable that the predefined correlation (the conversion table) 158 be set in such a manner that it outputs a digital voltage value ($V_{output}$) corresponding to a full-charge voltage in the case that the voltage (an analog voltage ($V_{analog}$)) of the electric power source 10 is the full-charge voltage, and outputs a digital voltage value ($V_{output}$) corresponding to a discharge cutoff voltage in the case that the voltage (an analog voltage ($V_{analog}$)) of the electric power source 10 is the discharge cutoff voltage.

However, due to a product error relating to the reference voltage, deterioration of the electric power source 10, or the like, an error may be included in the outputted digital voltage value ($V_{output}$). Thus, it is preferable that the predefined correlation (the conversion table) 158 in the voltage sensor 150 be calibrated (calibration be performed) appropriately.

Figure 15:
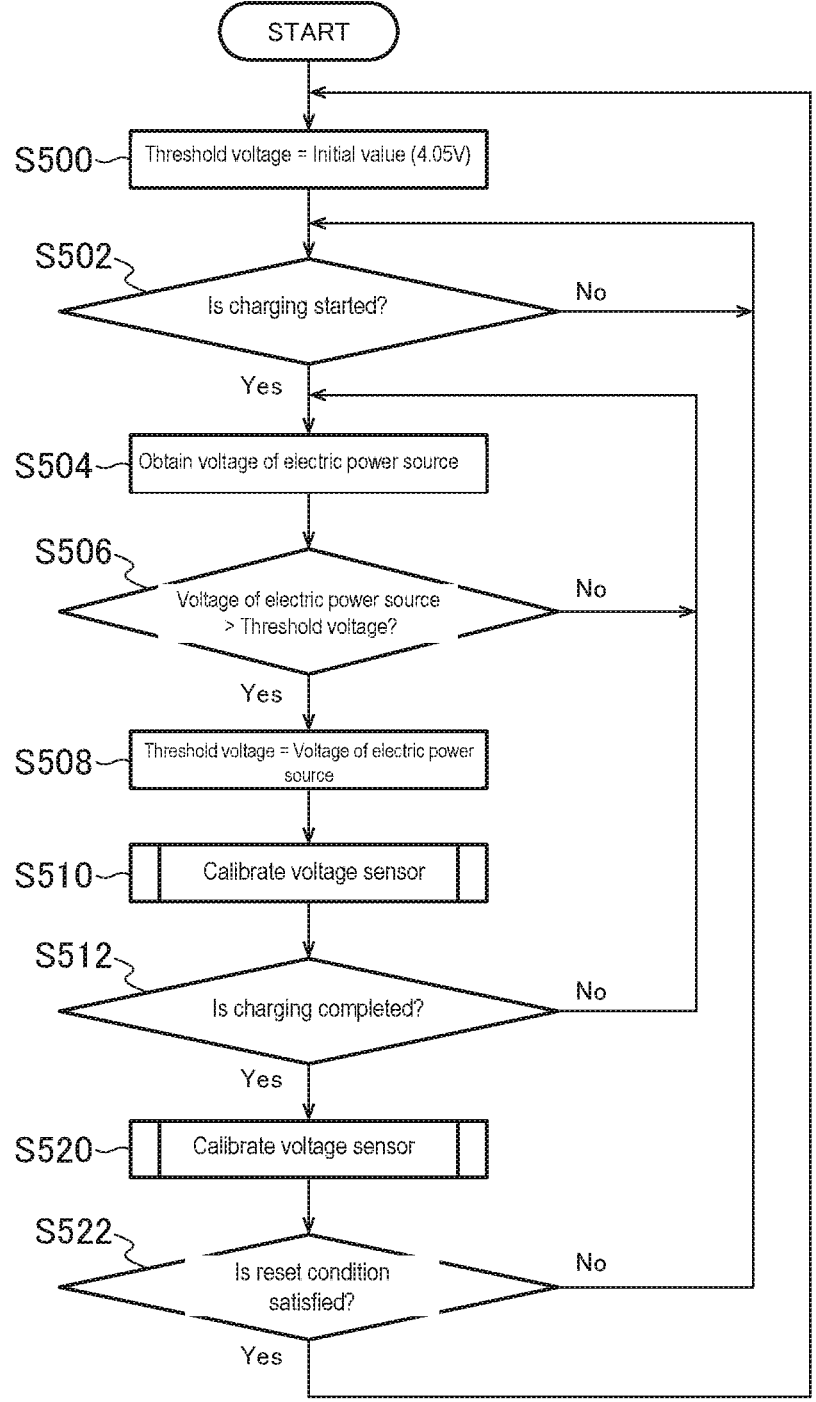
FIG. 15 is a flow chart showing a process relating to calibration of a predefined correlation of a voltage sensor.

Next, calibration of the predefined correlation (the conversion table) 158 in the voltage sensor 150 will be explained. FIG. 15 is a flow chart showing a process relating to calibration of the predefined correlation 158 of the voltage sensor 150. The control unit 50 may be configured to be able to calibrate the correlation 158, based on change in an analog voltage value obtained during charging of the electric power source 10 or the digital voltage value.

First, the threshold voltage is set to an initial value (step S500). In this regard, it is preferable that the initial value of the threshold voltage be a value smaller than the full-charge voltage represented by a digital voltage value. For example, the initial value of the threshold voltage is 4.05 V.

The control unit 50 detects start of charging (step S502). Start of charging may be detected based on connection of the charger 200 to the electric equipment unit 110. After charging is started, the control unit 50 obtains the voltage of the electric power source 10 at every predetermined time (step S504). The obtained voltage of the electric power source 10 may be a digital voltage value outputted from the voltage sensor 150.

Next, the control unit 50 judges whether the obtained voltage of the electric power source 10 is higher than the threshold voltage (step S506). If the obtained voltage of the electric power source 10 is equal to or less than the threshold voltage, the voltage of the electric power source 10 is obtained again after predetermined time has elapsed (step S504), and the process returns to step S506.

If the obtained voltage of the electric power source 10 is larger than the threshold voltage, the value of the threshold voltage is updated to the obtained voltage of the electric power source 10 (step S508). Thereafter, the control unit 50 calibrates, as necessary, the predefined correlation 158 in the voltage sensor 150 (step S510).

Next, the control unit 50 judges whether charging has been completed (step S512). If charging has not yet been completed, the voltage of the electric power source 10 is obtained again (step S504), and the process returns to step S506. During the period until charging is completed, the control unit 50 may calibrate the predefined correlation 158 in the voltage sensor 150 every time the voltage of the electric power source 10 becomes larger than the threshold voltage. In the above case, the control unit 50 is not required to perform the process (step S520) for calibrating the predefined correlation 158 in the voltage sensor 150, after completion of charging.

Alternatively, the control unit 50 may not be required to calibrate the predefined correlation 158, during the period from start of charging to completion of charging. That is, the control unit 50 is not required to perform step S510. In the above case, the control unit 50 performs the process for calibrating the predefined correlation 158 (step S520), after completion of charging.

As explained above, the control unit 50 may execute, at either one of timing of step S510 and timing of step S520, the process for calibrating the predefined correlation 158 in the voltage sensor 150.

After completion of charging of the electric power source 10, the threshold voltage is reset to the initial value, for example, 4.05 V, again if a predetermined reset condition is satisfied (step S522). The reset condition may be an event that the inhalation component generation device 100 is turned off, for example. This is because there is possibility that the factors that may result in generation of an error in the digital voltage value ($V_{output}$) outputted from the voltage sensor 150, such as a product error, deterioration in the electric power source 10, and so on, may change every time the reset condition, such as turning off of the inhalation component generation device 100, is satisfied.

In the flow chart shown in FIG. 15, it is preferable that the threshold voltage at the time of production or activation of the inhalation component generation device 100 be set to a value smaller than the full-charge voltage of the electric power source 10. If it is considered that an error may be included in the digital output value of the voltage sensor 150, the digital output value of the voltage sensor 150 may stay below the full-charge voltage, even if the voltage (the analog voltage) of the electric power source 10 has reached the full-charge voltage during charging of the electric power source 10 for the first time. Thus, by setting the threshold voltage at the time of production or activation of the inhalation component generation device 100 to a value smaller than the full-charge voltage, it becomes possible to prevent, at the time of first charging after production or activation of the inhalation component generation device 100, occurrence of a state wherein calibration of the predefined correlation 158 in the voltage sensor 150 is prevented.

More specifically, it is preferable that the threshold voltage at the time of production or activation of the inhalation component generation device 100 be set to a value equal to or less than a value that is in plural digital voltage values, that can be outputted from the voltage sensor 150, and is obtained by subtracting an absolute value of a product error from the full-charge voltage (for example, 4.2 V) of the electric power source 10. For example, in the case that an error of approximately ±0.11 V is generated in relation to the voltage sensor 150, the threshold voltage at the time of production or activation of the inhalation component generation device 100 may be set to 4.09 V or that below it.

Further, it is preferable that the threshold voltage at the time of production or activation of the inhalation component generation device 100 be set to a value, that is in the plural digital voltage values that can be outputted from the voltage sensor 150, and is the maximum in the range of values wherein any of the values in the range is equal to or less than the value obtained by subtracting the absolute value of the product error from the full-charge voltage (for example, 4.2 V) of the electric power source 10. By setting the threshold voltage at the time of production or activation of the inhalation component generation device 100 in the above manner, it becomes possible to prevent, at the time of first charging after production or activation of the inhalation component generation device 100, the above-explained occurrence of the state wherein calibration of the predefined correlation 158 in the voltage sensor 150 is prevented. Further, compared with the case that the threshold voltage at the time of production or activation of the inhalation component generation device 100 is set to a value, that is in the plural digital voltage values that can be outputted from the voltage sensor 150, and is other than the maximum in the range of values wherein any of the values in the range is equal to or less than the value obtained by subtracting the absolute value of the product error from the full-charge voltage (for example, 4.2 V) of the electric power source 10, occurrence of the case that calibration of the voltage sensor 150 is performed frequently can be suppressed.

For example, in the case that the resolution of the digital voltage value is 0.05 V/bit and the error that may occur in the voltage sensor 150 is approximately ±0.11 V, the threshold voltage at the time of production or activation of the inhalation component generation device 100 may be 4.05 V. The above matter would be obvious from matters that the above voltage value is a voltage value equal to or less than 4.09 V that is obtained by subtracting the absolute value of the product error from the full-charge voltage of the electric power source 10, and that the maximum digital voltage value, in the digital voltage values that can be outputted from the voltage sensor 150 (for example, 3.95 V, 4.00 V, and 4.05 V), is 4.05 V.

In the above-explained flow chart, the control unit 50 performs calibration of the predefined correlation 158, when the digital voltage value obtained during charging of the electric power source 10 becomes larger than the threshold voltage. Alternatively, the control unit 50 may perform calibration of the predefined correlation 158, when the digital voltage value obtained during charging of the electric power source 10 becomes a maximum value or a maximal value.

By recording history of digital voltage values outputted from the voltage sensor 150, the control unit 50 can extract a maximum value of the digital voltage values obtained during a period from start to completion of charging.

Further, by detecting decrease in the digital voltage values outputted from the voltage sensor 150, the control unit 50 can extract a maximal value of the digital voltage values obtained during a period from start to completion of charging.

It should be reminded that calibration of the predefined correlation 158 in the voltage sensor 150 is not necessarily required to be performed at timing shown in the above-explained flow chart, and it may be performed at any timing, such as timing during charging, timing after charging, timing of next activation of the inhalation component generation device 100, and so on.

(Calibration of Predefined Correlation)

Next, calibration of the predefined correlation 158 in the voltage sensor 150 will be explained. The control unit 50 calibrates the predefined correlation 158 in such a manner that the maximum value or the maximal value of the digital voltage values obtained during charging of the electric power source 10, or a digital voltage value larger than the threshold voltage, corresponds to the full-charge voltage value of the electric power source 10. In this regard, even in the case that the predefined correlation 158 is calibrated in such a manner that a digital voltage value larger than the threshold voltage corresponds to the full-charge voltage value of the electric power source 10, the predefined correlation 158 is calibrated, finally, in such a manner that the maximum value or the maximal value of the digital voltage values obtained in at least a section during charging of the electric power source 10 corresponds to the full-charge voltage value of the electric power source 10, if the electric power source 10 is charged until it has the full-charge voltage.

In the case that the electric power source 10 has been charged until it becomes the full-charge state, the voltage of the electric power source 10 has been reached the full-charge voltage. Also, since the full-charge voltage of the electric power source 10 is less susceptible to the factors, such as a product error with respect to a reference voltage or the like, deterioration in the electric power source 10, and so on, that result in generation of an error in the digital voltage value ($V_{output}$) outputted from the voltage sensor 150, the full-charge voltage value of the electric power source 10 is especially useful as a reference when performing calibration. Thus, if the correlation 158 is calibrated as explained above, the voltage sensor 15 outputs a digital voltage value corresponding to the full-charge voltage value, when an analog voltage value corresponding to the full-charge voltage is inputted to the voltage sensor 150. Thus, the voltage sensor 150 can be corrected appropriately.

Figure 16:
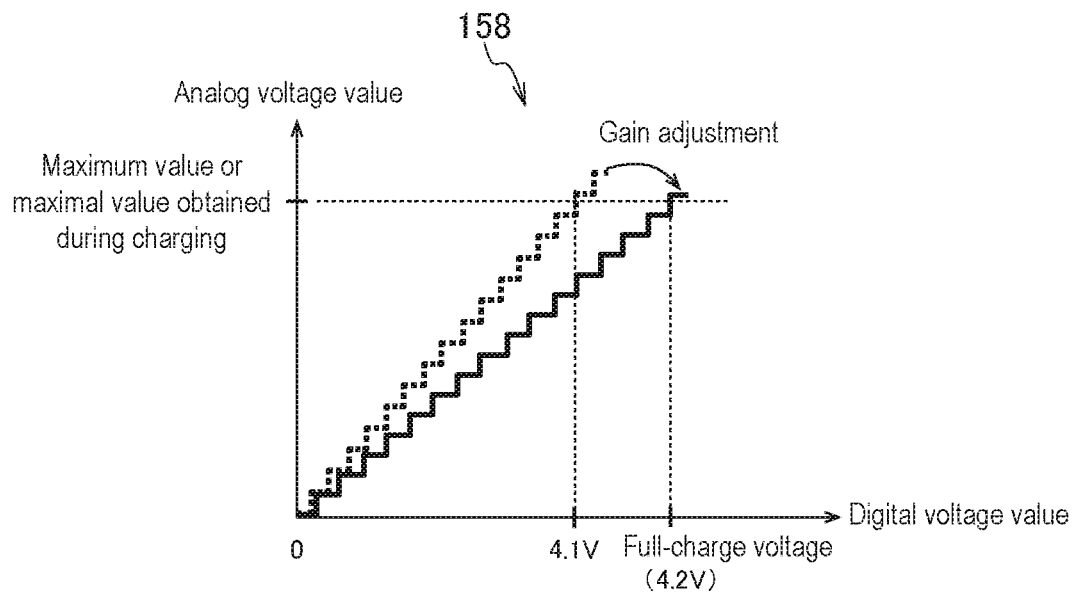
FIG. 16 is a figure showing an example of calibration of a predefined correlation of a voltage sensor.

FIG. 16 is a figure showing an example of calibration of the predefined correlation 158 of the voltage sensor 150. As shown in FIG. 16, the predefined correlation 158 may be calibrated in such a manner that gain adjustment of correspondence between the analog voltage values and digital voltage values is made. The gain adjustment may be implemented, for example, by increasing or decreasing, with a constant ratio, the values of the vertical axis (the analog voltage values) or the vales of the horizontal axis (the digital voltage values) of the predefined correlation 158. That is, in the gain adjustment, the slope of the predefined correlation 158, more specifically, the slope of the approximate straight line of the predefined correlation 158, is adjusted.

Figure 17:
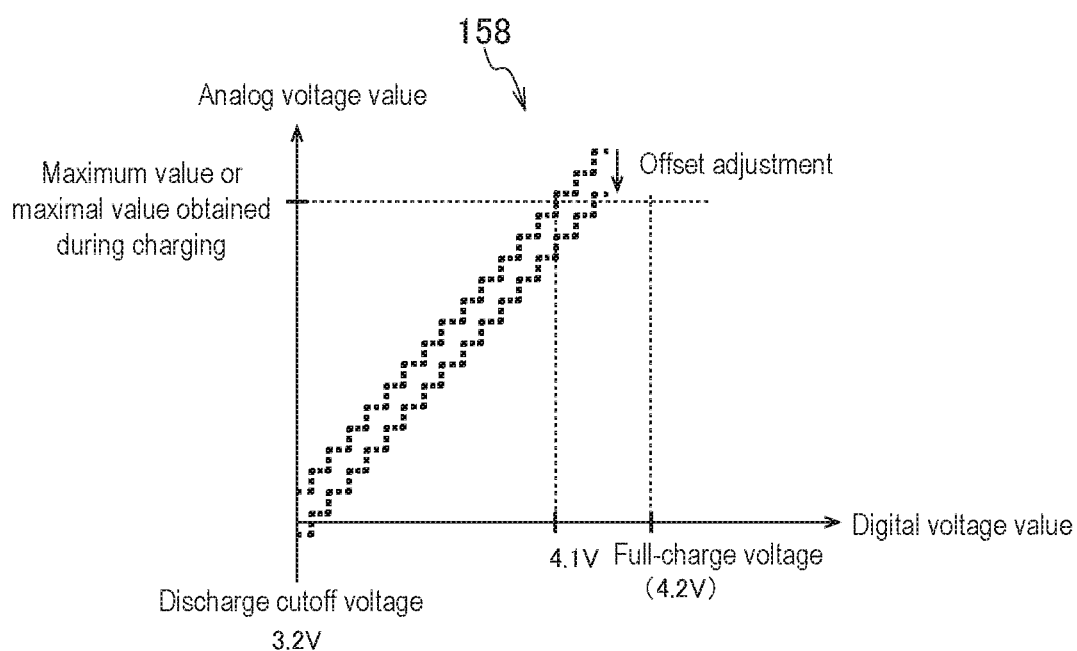
FIG. 17 is a figure showing a different example of calibration of a predefined correlation of a voltage sensor.

FIG. 17 is a figure showing a different example of calibration of the predefined correlation 158 of the voltage sensor 150. As shown in FIG. 17, the predefined correlation 158 may be calibrated in such a manner that offset adjustment of correspondence between the analog voltage values and digital voltage values is made. The offset adjustment may be implemented, for example, by increasing or decreasing, by a constant value, the values of the vertical axis (the analog voltage values) of the predefined correlation 158. The offset adjustment is that wherein the intercept of the predefined correlation 158, specifically, the intercept of the approximate straight line of the predefined correlation 158, is merely increased or decreased by a constant value, so that it has an advantage that adjustment with respect thereto is easy.

Both before and after performing of the offset adjustment, it is necessary that relationship between the analog voltage values and the digital voltage values be defined, in the range between the discharge cutoff voltage and the full-charge voltage. Thus, it is preferable that the predefined correlation 158 include at least one of correspondence between the analog voltage values and the digital voltage values that are smaller than the discharge cutoff voltage of the electric power source 10 and correspondence between the analog voltage values and the digital voltage values that are larger than the full-charge voltage of the electric power source 10.

The predefined correlation 158 may maintain correlation, once it is calibrated, without changing it until next calibration. Alternatively, the predefined correlation 158 may be restored to have an initial correlation when the inhalation component generation device 100 is shut down or activated thereafter. In this regard, the initial correlation may be a predefined correlation at the time of production of the inhalation component generation device 100.

At the time of production or activation of the inhalation component generation device 100, it is preferable that the predefined correlation 158 be calibrated or set in such a manner that an analog voltage value, that is smaller than an analog voltage value corresponding to the full-charge voltage value when no error exists in the voltage sensor 150, corresponds to a digital voltage value in the full-charge state. That is, at the time of production or activation of the inhalation component generation device 100, the voltage sensor 150 is designed to output a digital voltage value corresponding to the full-charge voltage, when a predetermined analog voltage value that is smaller than the full-charge voltage is inputted to the voltage sensor 150. For example, at the time of production or activation of the inhalation component generation device 100, the voltage sensor 150 is designed to output a digital voltage value (4.2 V) corresponding to the full-charge voltage, when an analog voltage value of 4.1 V that is smaller than the full-charge voltage (4.2 V) is inputted to the voltage sensor 150. Thus, the voltage sensor 150 is configured to output a digital voltage value equal to or larger than an actual analog voltage value, at the time of production or activation of the inhalation component generation device 100, even if a production error exists.

In the above case, it becomes possible to prevent, at the time of first charging after production or activation of the inhalation component generation device 100, occurrence of a state wherein an actual analog voltage value of the electric power source 10 exceeds the full-charge voltage before the control unit 50 recognizes that the voltage has reached the full-charge voltage. In other words, in the case that the voltage sensor 150 outputs a digital voltage value smaller than an actual value of the voltage of the electric power source 10 due to a production error and so on, it becomes possible to suppress occurrence of overcharge, wherein the voltage value of the electric power source 10 exceeds the full-charge voltage, at the time that the voltage sensor 150 outputs a digital voltage value corresponding to the full-charge voltage of the electric power source 10. Thus, if the control unit 50 has a process for forcibly stopping charging when the output voltage value from the voltage sensor 150 exceeds the full-charge voltage, overcharge of the electric power source 10 can be prevented.

It is preferable that the predefined correlation 158 at the time of production or activation of the inhalation component generation device 100 be calibrated or set in such a manner that an analog voltage value, that corresponds to a value that is the closest to a value obtained by subtracting an absolute value of the product error from the full-charge voltage of the electric power source 10 when no product error exists in the voltage sensor 150, in plural digital voltage values that can be outputted from the voltage sensor 150, corresponds to the full-charge voltage value. As a result, it becomes possible to suppress occurrence of the state that the electric power source 10 enters an overcharge state, by underestimating the voltage of the electric power source 10 due to a product error and so on. Further, in the initial state of the predefined correlation 158, differences in values between the analog voltage values and the digital voltage values become large, so that it becomes possible to suppress deviation of relationship between an actual value of the electric power source 10 and a digital voltage corresponding thereto.

(The Other Construction of Predefined Correlation)

Figure 18:
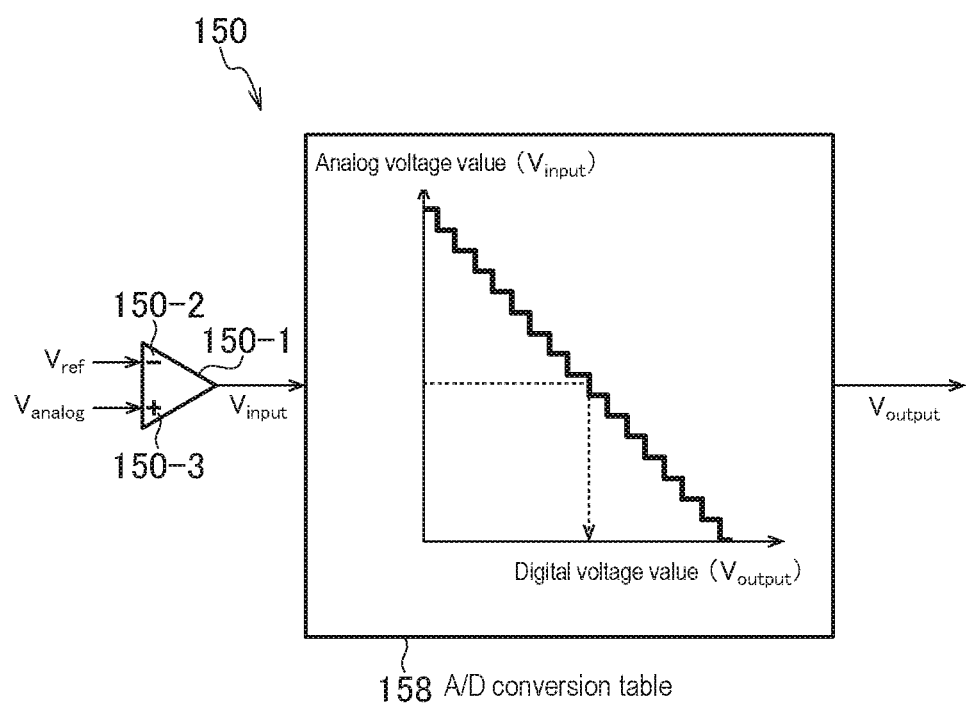
FIG. 18 is a figure showing blocks in a voltage sensor relating to a different embodiment.

FIG. 18 is a figure showing blocks in a voltage sensor 150 relating to a different embodiment. The construction of the voltage sensor 150 is similar to that shown in FIG. 14, except for the voltages inputted to an inversion input terminal 150-2 and a non-inversion input terminal 150-3 and a predefined correlation (a conversion table) 158.

In the present embodiment, the conversion table 158 shows relationship in the case that a reference voltage ($V_{ref}$) 156, that will be explained later, is smaller than a voltage of the electric power source 10, for example, the discharge cutoff voltage of the electric power source 10. In the above case, in the predefined correlation 158, a smaller analog voltage value is associated with a larger digital voltage value.

In a general A/D converter using an operational amplifier, a digital value of a value inputted to a non-inversion input terminal corresponds to the maximum digital value that can be outputted. In the embodiment shown in FIG. 14, since the constant reference voltage ($V_{ref}$) 156 is inputted to the non-inversion input terminal 150-3, the maximum digital value that can be outputted is constant. On the other hand, in the embodiment shown in FIG. 18, since a voltage ($V_{analog}$) of the electric power source 10, that changes according to the quantity of electric power stored in the electric power source 10, is inputted to the non-inversion input terminal 150-3, the maximum digital value that can be outputted varies. Further, irrespective of the maximum digital value, an analog value corresponding to the maximum digital value is determined based on arithmetic capacity of the control unit 50 and/or the voltage sensor 150 and so on.

That is, in the embodiment shown in FIG. 14, an analog voltage value ($V_{input}$) of a voltage of the electric power source 10 inputted to the inversion input terminal 150-2 is converted to a digital value, and the digital value is outputted as a digital output value ($V_{output}$). Also, in the embodiment shown in FIG. 18, an analog voltage value ($V_{input}$) of a voltage of the electric power source 10 inputted to the non-inversion input terminal 150-3 is converted to a digital value, and the digital value is outputted as a digital output value ($V_{output}$).

Thus, in the embodiment shown in FIG. 14, the conversion table 158 is first derived from a constant maximum digital value and a constant analog value corresponding thereto. Next, an analog voltage value ($V_{input}$) inputted to the conversion table 158 is converted to a digital voltage value ($V_{output}$) corresponding thereto and the digital voltage value is outputted. The digital voltage value ($V_{output}$) corresponds to a digital value of the voltage of the electric power source 10 inputted to the inversion input terminal 150-2.

On the other hand, in the embodiment shown in FIG. 18, the conversion table 158 is first derived from a constant digital value and an analog voltage value ($V_{input}$) corresponding thereto. Next, by using the conversion table 158, a constant analog value corresponding to a maximum digital value is converted to a digital voltage value ($V_{output}$) and the digital voltage value is outputted. The digital voltage value ($V_{output}$) corresponds to a digital value of the voltage of the electric power source 10 inputted to the non-inversion input terminal 150-3.

Specifically, a result of association between coordinates, that comprise measured or known digital values and corresponding analog values, and predefined relationship between digital voltage values ($V_{output}$) and analog voltage values ($V_{input}$) may be set as the conversion table 158. For example, in the case that relationship between digital voltage values ($V_{output}$) and analog voltage values ($V_{input}$) is approximated as a straight line passing through a predefined intercept, the conversion table 158 may be set in such a manner that the coordinates and the intercept are positioned on the approximate straight line. In this regard, it would be obvious to a person skilled in the art that relationship between digital voltage values ($V_{output}$) and analog voltage values ($V_{input}$) may be approximated by using a curved line, in addition to a straight line.

In both the embodiments shown in FIG. 14 and FIG. 18, the measured or known digital value and the corresponding analog value are a digital value and a corresponding analog value of the reference voltage ($V_{ref}$) 156. In the embodiment shown in FIG. 14, since the reference voltage ($V_{ref}$) 156 is inputted to the non-inversion input terminal 150-3, it is not necessary to measure an analog value corresponding to the reference voltage ($V_{ref}$) 156. On the other hand, it should be reminded that, in the embodiment shown in FIG. 18, since the reference voltage ($V_{ref}$) 156 is inputted to the inversion input terminal 150-2, it is necessary to measure an analog value corresponding to the reference voltage ($V_{ref}$) 156.

It should be reminded that, regarding a construction such as that of the embodiment shown in FIG. 14 wherein an analog voltage value ($V_{input}$) is converted to a digital value of a value inputted to the inversion input terminal 150-2 of the operational amplifier 150-1 and the digital value is outputted as a digital voltage value ($V_{output}$), it has been known that a larger analog voltage value is associated with a larger digital voltage value. On the other hand, it should be reminded that, regarding a construction such as that of the embodiment shown in FIG. 18 wherein an analog voltage value ($V_{input}$) is converted to a digital value of a value inputted to the non-inversion input terminal 150-3 of the operational amplifier 150-1 and the digital value is outputted as a digital voltage value ($V_{output}$), a smaller analog voltage value is associated with a larger digital voltage value.

In this regard, it is preferable that the predefined correlation (the conversion table) 158 be set in such a manner that a digital voltage value ($V_{output}$) corresponding to the full-charge voltage is outputted when the voltage (the analog voltage ($V_{analog}$)) of the electric power source 10 is the full-charge voltage, and a digital voltage value ($V_{output}$) corresponding to the discharge cutoff voltage is outputted when the voltage (the analog voltage ($V_{analog}$)) of the electric power source 10 is the discharge cutoff voltage.

However, there may be a case wherein an outputted digital voltage value ($V_{output}$) includes an error due to a product error, deterioration in the electric power source 10, and so on. Thus, it is preferable to appropriately calibrate (perform calibration of) the predefined correlation (the conversion table) 158 in the voltage sensor 150.

Control relating to calibration of the predefined correlation (the conversion table) 158 may be implemented in a manner similar to that in the above-explained flow chart (refer to FIG. 15). Although it may be possible to perform calibration of the predefined correlation (the conversion table) 158 by using the gain correction shown in FIG. 16 or the offset correction shown in FIG. 17 as explained above, it should be reminded that an analog value corresponding to a maximum digital value is calibrated in both the gain correction and the offset correction.

In this regard, it should be reminded that it is preferable that the predefined correlation 158 at the time of production or activation of the inhalation component generation device 100 be set in such a manner that an analog voltage value ($V_{input}$) that is larger than an analog voltage value corresponding to the full-charge voltage value, when the voltage sensor 150 has no error, is calibrated or set to correspond to the full-charge voltage value. That is, it is designed in such a manner that, at the time of production or activation of the inhalation component generation device 100, if an analog voltage value associated with a predetermined voltage of the electric power source 10, that is smaller than the full-charge voltage, is inputted to the voltage sensor 150, the voltage sensor 150 outputs a digital voltage value corresponding to the full-charge voltage. For example, it may be designed in such a manner that, at the time of production or activation of the inhalation component generation device 100, if an analog voltage value associated with 4.1 V, that is smaller than the full-charge voltage (4.2 V), is inputted to the voltage sensor 150, the voltage sensor 150 outputs a digital voltage value (4.2 V) corresponding to the full-charge voltage. Thus, even if a production error is included, the voltage sensor 150 is configured to output a digital voltage value equal to or greater than an actual analog voltage value, at the time of production or activation of the inhalation component generation device 100.

(Voltage of Electric Power Source Obtained by Control Unit)

In the case that the control unit 50 (the control section 51) obtains the voltage of electric power source 10 in all of the above-explained processes, it may obtain a digital voltage value ($V_{output}$) outputted from the voltage sensor 150. That is, it is preferable that the control unit 50 (the control section 51) perform the above-explained various control processes based on a digital voltage value that is outputted from the voltage sensor 150 by use of the calibrated predefined correlation 158. As a result, the control unit 50 (the control section 51) can perform the above-explained various control processes precisely.

For example, the above-explained power control unit may control supply of electric power from the electric power source 10 to the load 121R, based on a digital voltage value outputted from the voltage sensor 150. More specifically, the power control unit may implement PWM control of electric power supplied from the electric power source 10 to the load 121R, based on a digital voltage value.

Also, in a different example, control unit 50 may estimate or detect at least one of deterioration and failure in the electric power source 10 (the first diagnosis function and/or the second diagnosis function), based on a digital voltage value that is outputted from the voltage sensor 150 by use of the calibrated predefined correlation 158.

(Program and Storage Medium)

The above-explained flow shown in each of FIGS. 7, 9, 12, and 15 may be executed by the control unit 50. That is, the control unit 50 may comprise a program that makes the inhalation component generation device 100 perform the above-explained method and a storage medium in which the program is stored. Further, the above-explained flow shown in FIG. 11, and, as necessary, the above-explained flow shown in FIG. 12, may be executed by the processor 250 in the external charger 200. That is, the processor 250 may comprise a program that makes the inhalation component generation device 100 and the charger 200 perform the above-explained method and a storage medium in which the program is stored.

OTHER EMBODIMENTS

Although the present invention has been explained by use of the above embodiments, the descriptions and figures that are components of part of the disclosure should not be interpreted as those used for limiting the present invention. From the disclosure, various alternative embodiments, examples, and operation techniques would become apparent to a person skilled in the art.

For example, in the first diagnosis function shown in FIG. 9, the control unit 50 is configured to be able to estimate or detect at least one of deterioration and failure in the electric power source 10, based on a value relating to the quantity of operation of the load 121R operated when an obtained voltage value of the electric power source 10 is in a predefined voltage range. Alternatively, the control unit 50 may be configured to be able to estimate or detect at least one of deterioration and failure in the electric power source 10, based on a voltage of the electric power source 10 that has been changed during a state that a value relating to an obtained quantity of operation of the load 121R is in a predefined range. Even in the above case, it is should be reminded that at least one of deterioration and failure in the electric power source 10 can be estimated or detected in a manner similar to those in the cases explained in relation to the above embodiments. Further, a method comprising a step for obtaining a value relating to a quantity of operation of the load 121R, and a step for estimating or detecting at least one of deterioration and failure in the electric power source 10, based on a voltage of the electric power source 10 that has been changed during a state that a value relating to an obtained quantity of operation of the load 121R is in a predefined range, is similarly included within the scope of the present invention. Further, it should be reminded that a program that makes the inhalation component generation device 100 perform a method such as that explained above is also included within the scope of the present invention.

The invention claimed is:

1. An inhalation component generation device, comprising:
    a load for vaporizing or atomizing an inhalation component source by electric power from an electric power source;
    a voltage sensor configured to convert an analog voltage value of the electric power source to a digital voltage value by using a predefined correlation, and output the digital voltage value; and
    circuitry configured to
        control, based on the digital voltage value, supply of electric power from the electric power source to the load; and
        calibrate the correlation, based on change in the digital voltage value or the analog voltage value obtained during charging of the electric power source, so that a maximal value of the digital voltage value, or the digital voltage value greater than a threshold value, obtained during charging of the electric power source, corresponds to a full-charge voltage value of the electric power source,
    wherein the correlation at the time of production or activation of the inhalation component generation device is calibrated or set so that an analog voltage value, that is larger than an analog voltage value corresponding to a full-charge voltage value in a case that no error exists in the voltage sensor, corresponds to the full-charge voltage value.

2. An inhalation component generation device, comprising:
    a load for vaporizing or atomizing an inhalation component source by electric power from an electric power source;

a voltage sensor configured to convert an analog voltage value of the electric power source to a digital voltage value by using a predefined correlation, and output the digital voltage value; and circuitry configured to
control, based on the digital voltage value, supply of electric power from the electric power source to the load; and
calibrate the correlation, based on change in the digital voltage value or the analog voltage value obtained during charging of the electric power source, so that a maximal value of the digital voltage value, or the digital voltage value greater than a threshold value, obtained during charging of the electric power source, corresponds to a full-charge voltage value of the electric power source, wherein the correlation at the time of production or activation of the inhalation component generation device is calibrated or set so that an analog voltage value, that is smaller than the analog voltage value corresponding to a full-charge voltage value in a case that no error exists in the voltage sensor, corresponds to the full-charge voltage value, wherein the correlation at the time of production or activation of the inhalation component generation device is calibrated or set so that the analog voltage value, that corresponds to a value that is the closest to a value obtained by subtracting an absolute value of an error from the full-charge voltage value, in a case that no error exists in the voltage sensor, in a plurality of the digital voltage values that can be output from the voltage sensor, corresponds to the full-charge voltage value.

3. The inhalation component generation device of claim 2, wherein the circuitry is configured to
determine whether a digital voltage value output by the voltage sensor during charging of the electric power source exceeds a threshold value; and
calibrate the correlation in a case that the digital voltage value has exceeded the threshold value,
wherein in a case that the digital voltage value output by the voltage sensor during charging of the electric power source has exceeded the threshold value, the circuitry updates the threshold value to the digital voltage value that has exceeded the threshold value.

4. The inhalation component generation device of claim 2, wherein the circuitry is configured to
determine whether a digital voltage value output by the voltage sensor during charging of the electric power source exceeds a threshold value; and
calibrate the correlation in a case that the digital voltage value has exceeded the threshold value, wherein the threshold value at the time of production or activation of the inhalation component generation device is set to a value that is in a plurality of the digital voltage values that can be output by the voltage sensor, and is equal to or smaller than a value obtained by subtracting an absolute value of an error from the full-charge voltage value, wherein the threshold value at the time of production or activation of the inhalation component generation device is set to a value that is in a plurality of the digital voltage values that can be output by the voltage sensor, and is the maximum value in a range of values wherein any of the values in the range is equal to or less than a value obtained by subtracting an absolute value of an error from the full-charge voltage value.

5. An inhalation component generation device comprising:
a load for vaporizing or atomizing an inhalation component source by electric power from an electric power source;
a voltage sensor configured to convert an analog voltage value of the electric power source to a digital voltage value by using a predefined correlation, and output the digital voltage value; and
circuitry configured to
control, based on the digital voltage value, supply of electric power from the electric power source to the load;
calibrate the correlation, based on change in the digital voltage value or the analog voltage value obtained during charging of the electric power source; and
estimate or detect at least one of deterioration and failure in the electric power source, based on a digital voltage value output by the voltage sensor by using the calibrated correlation, wherein
charging of the electric power source can be controlled by an external charger which is separate from the inhalation component generation device; and
the circuitry is configured to
block or reduce charging current to the electric power source; and
forcibly stop or restrict charging of the electric power source by the external charger, in a case that at least one of deterioration and failure in the electric power source is estimated or detected.

* * * * *